(12) United States Patent
Burns et al.

(10) Patent No.: US 8,233,250 B2
(45) Date of Patent: Jul. 31, 2012

(54) OVER VOLTAGE PROTECTION OF SWITCHING CONVERTER

(75) Inventors: Lawrence M. Burns, Los Altos, CA (US); David Fisher, Sunnyvale, CA (US)

(73) Assignee: R2 Semiconductor, Inc., Sunnyvale, CA (US)

( * ) Notice: Subject to any disclaimer, the term of this patent is extended or adjusted under 35 U.S.C. 154(b) by 233 days.

(21) Appl. No.: 12/646,451

(22) Filed: Dec. 23, 2009

(65) Prior Publication Data

US 2011/0148200 A1    Jun. 23, 2011

(51) Int. Cl.
H02H 7/00 (2006.01)
H02H 9/00 (2006.01)
H02H 3/20 (2006.01)
H02H 9/04 (2006.01)

(52) U.S. Cl. .......................................... 361/18; 361/91.1
(58) Field of Classification Search ...................... 361/18
See application file for complete search history.

(56) References Cited

U.S. PATENT DOCUMENTS

| | | | |
|---|---|---|---|
| 3,353,066 A | 11/1967 | De Souza | |
| 4,521,725 A | 6/1985 | Phaneuf | |
| 5,126,651 A | 6/1992 | Gauen | |
| 5,408,150 A | 4/1995 | Wilcox | |
| 6,169,392 B1 | 1/2001 | Kitagawa | |
| 7,015,544 B2 | 3/2006 | Lotfi et al. | |
| 7,026,797 B2 | 4/2006 | McCune | |
| 7,132,891 B1 | 11/2006 | Dening et al. | |
| 7,157,891 B1 | 1/2007 | Drury et al. | |
| 7,202,648 B2 | 4/2007 | Gardner et al. | |
| 7,218,085 B2 | 5/2007 | Abedinpour et al. | |
| 7,268,410 B1 | 9/2007 | Hopper et al. | |
| 7,482,792 B2 | 1/2009 | Burton et al. | |
| 7,667,991 B2 * | 2/2010 | Leyh | 363/132 |
| 2003/0169549 A1 | 9/2003 | Ziemer et al. | |
| 2008/0130181 A1 | 6/2008 | Pinna et al. | |
| 2009/0116159 A1 | 5/2009 | Xu et al. | |
| 2009/0289611 A1 | 11/2009 | Mangtani et al. | |

OTHER PUBLICATIONS

"A 65MHZ Switching Rate, Two-Stage Interleaved Synchronous Buck Converter with Fully Integrated Output Filter", S. Abedinpour, B. Bakkaloglu and S. Kiaei, ISCAS 2006 p. 5315.
"A Multistage Interleaved Synchronous Buck Converter With Integrated Output Filter in 0.18 μm SiGe Process", S. Abedinpour, B. Bakkaloglu and S. Kiaei, IEEE Trans Power Electronics v 22 #6 p. 2164 (2007).
"A 660MHz ZVS DC-DC Converter Using Gate-Driver Charge-Recycling in 0.18μm CMOS with an Integrated Output Filter", Mendi Alimadadi, Samad Sheikhaei, Guy Lemieux, Patrick Palmer, Shahriar Mirabbasi, William Dunford, IEEE Power Electronics Specialists Conference 2008, p. 140.

(Continued)

*Primary Examiner* — Dharti Patel
(74) *Attorney, Agent, or Firm* — Brian R. Short

(57) ABSTRACT

Embodiments for at least one method and apparatus of generating a regulated voltage are disclosed. One apparatus includes a voltage regulator. The voltage regulator includes regulator circuitry for generating a regulated voltage from a first power supply and a second power supply, and voltage spike protection circuitry for voltage-spike-protecting the regulator circuitry, wherein the voltage spike protection circuitry includes a dissipative element and a charge-storage circuit. One method includes a method of generating a regulated voltage. The method includes regulator circuitry generating a regulated voltage from an input voltage, and voltage-spike-protecting the regulator circuitry with voltage spike protection circuitry, wherein the voltage spike protection circuitry includes a dissipative element and a charge-storage circuit.

31 Claims, 22 Drawing Sheets

OTHER PUBLICATIONS

"A 233-MHz 80%-87% Efficient Four-Phase DC-DC Converter Utilizing Air-Core Inductors on Package", Peter Hazucha, Gerhard Schrom, Jaehong Hahn, Bradley A. Bloechel, Paul Hack, Gregory E. Dermer, Siva Narendra, Donald Gardner, Tanay Karnik, Vivek De, and Shekhar Borkar, IEEE J Solid-State Ckts v 40 #4 p. 838 (2005).

"Oxide Breakdown after RF Stress: Experimental Analysis and Effects on Power Amplifier Operation", L. Larcher, D. Sanzogni, R. Brama, Z. Mazzanti and F. Svelto, IEEE 44th Annual Reliability Physics Symposium, San Jose, CA, 2006.

"A Breakdown Voltage Multiplier for High Voltage Swing Drivers", S. Mandegaran and A. Hajimiri, IEEE Journal of Solid-State circuits v. 42, p. 302 (2007).

"A 90-240 MHz Hysteretic Controlled DC-DC Buck Converter with Digital PLL Frequency Locking", P. Li, D. Bhatia, L. Xue and R. Bashirullah, IEEE 2008 Custom Integrated Circuits Conference (CICC) paper 3-2-1 p. 21.

"Fundamental Considerations for Very High Frequency Power Conversion", R. Redl, International Workshop on Power Supply on Chip (Power SOC), Cork, Ireland, Sep. 2008.

"Design Considerations for Very High Frequency DC-DC Converters", J. Rivas, D. Jackson, O. Leitermann, A. Sagneri, Y. Han, D. Perrault, IEEE Power Electronics Specialists Conference 2006.

"A 100 MHz Eight-Phase Buck Converter Delivering 12 A in 25 mm2 Using Air-Core Inductors", G. Schrom et. al., APEC 2007.

"Integrated Class DE Synchronized DC-DC Converter for On-Chip Power Supplies", T. Suetsugu and M. Kazimierczuk, IEEE Power Electronics Specialists Conference 2006.

"A High Power Density 1.75 mm2 Fully Integrated Closed-loop Buck Converter with Varactor Control Scheme", P. Upadhyaya, N. Shi, S. Bradburn and H. Hess, Twenty-third Annual IEEE Applied Power Electronics Conference (APEC) 2008, p. 31.

"A High-Efficiency DC-DC Converter Using 2 nH Integrated Inductors", J. Wibben and R. Harjani, IEEE J Solid-State Circuits v 43 #4, 2008.

"Controlled slew rate enhancement circuit for error amplifier in high frequency DC-DC converters", C. Zhang and Z. Shao, IEEE Asia Pacific Conference on Circuits and Systems (APCCAS) 2008 p. 1852.

"A New Current-Source Gate Driver for a Buck Voltage Regulator", Z. Zhang, W. Eberle, Y. Liu and P. Sen, Twenty-third Annual IEEE Applied Power Electronics Conference (APEC) 2008, p. 1433.

"An Inductive Down Converter System-in-Package for Integrated Power Management in Battery-powered Applications", H.J. Bergbeld, R. Karadi, K Nowak, 2008 IEEE, 978-1-4244-1668, p. 3335.

PCT Notification of Transmittal of the International Search Report and the Written Opinion of the International Searching Authority, of the Declaration, Oct. 17, 2011.

* cited by examiner

OVER VOLTAGE PROTECTION OF SWITCHING CONVERTER

FIELD OF THE DESCRIBED EMBODIMENTS

The described embodiments relate generally to power conversion. More particularly, the described embodiments relate to over voltage protection of a switching converter.

BACKGROUND

DC voltage converters and regulators are well-known in the art and are widely employed to ensure that the DC voltage provided to electronic devices is of the correct value independent of variations in the available supply voltage or the load presented by the device being powered. For example, most battery-operated consumer electronics devices use DC-DC regulators to convert the 2.7-5.5 V battery voltage down to a 0.56-3.4 V operating voltage required by the on-board integrated circuits. Voltage regulators are universally used to convert the battery voltage to the desired fixed value to be supplied to the integrated circuit, and to ensure that value remains constant as the battery ages and the current used by the integrated circuit changes.

Voltage regulators can be classified as either linear mode or switched mode. A linear regulator is essentially a resistive load placed in series (or in parallel) with the load to be powered; the resistance of the regulator is adjusted by a control circuit to ensure that the voltage at the regulator output is constant. In contrast, a switched regulator converts a DC input voltage to a time-varying voltage or current, and then makes use of rectifying or switching elements and passive components such as inductors and capacitors, in conjunction with a control circuit, to re-convert this time-varying signal to a DC voltage at a fixed value differing from the input voltage. FIG. 1 shows an example of a prior art linear voltage regulator and a prior art switching mode voltage regulator.

Linear regulators are simple to implement, fast-acting, and compact. Further, they do not radiate interfering signals (EMI). However, they have two important limitations. First, a linear regulator can only reduce and not increase the voltage presented to it. Secondly, linear regulators are very inefficient in many applications (or in cases where the output voltage is not slightly below the input voltage). Efficiency is defined as the ratio of output power divided by input power. In the case of an ideal linear regulator (in which no power is dissipated in the control or regulatory circuitry), the efficiency can be no better then $V_{out}/V_{in}$, where $V_{out}$ is the output voltage of the regulator and $V_{in}$ is the input voltage of the regulator. Thus, when a substantial reduction in the input voltage is called for by the application, a linear regulator must inevitably provide poor efficiency. Other regulator topologies, such as a shunt linear regulator, (wherein the regulator acts as a variable resistor in parallel with the load), can also be used, but produce substantially similar results. Particularly in the case of battery-powered devices, inefficient voltage regulation directly impacts the expected battery life and thus is highly undesirable. As a consequence of these limitations, switched mode converters are used for many electronic applications, particularly those where energy efficiency and/or battery life are of critical importance.

Unfortunately, most switched mode regulators require large valued (and physically large and thick) external inductors and capacitors to operate. To understand why, let us consider as an example a typical prior-art voltage-reducing ("buck") converter, shown in simplified form in FIG. 2 (note that the transistors might be PMOS or NMOS devices). The resulting time-dependent inductor current in the limit of ideal (instantaneous) switching is shown in FIG. 3. In operation, the series switching transistor $Q_{series}$ is switched on for a time interval $T_{on}$, allowing current to flow from the supply through the output inductor $L_{out}$. During this time period $T_{on}$, the output current 101 grows linearly with time, at a rate proportional to the difference between the input and output voltages, the latter being substantially fixed during the switching cycle if a sufficiently large output capacitor value $C_{out}$ is employed:

$$\frac{dI_{out}}{dt} = \frac{(V_{in} - V_{out})}{L_{out}} \qquad (1)$$

At the expiration of $T_{on}$, the switch $Q_{series}$ is turned off. After a short dead time, the switch $Q_{shunt}$ is then turned on, and the inductor current flows from ground through $Q_{shunt}$. Again the current 102 changes linearly with time, in this case decreasing with increasing time:

$$\frac{dI_{out}}{dt} = \frac{-V_{out}}{L_{out}} \qquad (2)$$

The current through the output inductor thus varies with time; this variation is known as inductor current ripple. For any given inductor value, if the time $T_{off}$ during which the series switch $Q_{series}$ is off is long enough, the inductor current will decrease to zero value and either reverse direction or be terminated by turning $Q_{shunt}$ off. The mode of operation in which current is terminated is known as "discontinuous" operation, in order to distinguish it from "continuous" operation, in which current is always being delivered to the load from the output inductor. In most practical converter designs, the variation in current with time (the ripple current) is chosen to be less than about 20 percent of the average output current, as a rule-of-thumb. The requirement for limiting ripple to 20% of the average current sets a minimum inductance value requirement:

$$L_{min} = \frac{V_{out}}{0.2\,(I_{out})} \frac{1 - V_{out}/V_{in}}{f_s} \qquad (3)$$

where (Iout) is the average output current of the converter and $f_s$ is the switching frequency. This relationship is depicted graphically in FIG. 4 for typical values of parameters relevant to mobile devices. (The line shown in the figure is specific to the 20% ripple limit mentioned above, and would shift position slightly if a different criterion were applied.) For converters operating in the traditional switching frequency range of 50 kHz to 1 MHz, it is apparent that inductors of on the order of 3 to 30 μH are required for continuous operation.

Such large inductance values are normally achieved by wrapping a conductor around a ferromagnetic core, greatly increasing the inductance obtained for a given number of turns of a given radius. At sufficiently low frequencies, these inductors have very low losses. However, they have several disadvantages.

The materials used to magnetically enhance the inductor have limitations on operational temperature (typically to −30 to +85° C.), and limitations on the peak current due to core saturation effects. A ferromagnetic material reaches saturation when the magnetization in the core material no longer increases in response to an increase in the magnetizing field from the windings. Saturation occurs when the magnitude of the magnetizing field is larger than a maximum value; the maximum value falls with increasing temperature, and is greatly reduced at high frequencies (typically>20 MHz). Core saturation leads to a significant reduction in inductance and an increase in loss, (both of the latter due to a large increase in inductor current). Therefore, the inductor cannot be allowed to saturate during normal regulator operation.

As a result, a magnetically-enhanced inductor must be carefully designed and selected for the application. For example, for the buck converter depicted in FIG. 2, the maximum load current is:

$$I_{load,max} = I_{out,max,DC} - I_{out,p-p} \quad (4)$$

$$I_{out,p-p} = I_{max} - I_{min} = (V_{in} - V_{out})\frac{V_{out}}{V_{in}}\frac{1}{f_s L_{out}}$$

Here $I_{out, max, DC}$ is the largest current that can flow in the output inductor without experiencing saturation. $I_{out, p-p}$ is the peak-to-peak variation in current as depicted in FIG. 3, and is expressed in terms of the input and output voltages and switching frequency under the assumption of ideal switching used previously.

For a given application, the maximum load current and the input and output voltages are fixed requirements. Thus, the core must be sized to support the required current for the application. Switching frequency can be increased to reduce the peak current encountered, but as noted above, at high frequencies the saturation magnetization falls, setting a limit on how much improvement can be obtained in that manner. At higher frequency the core losses begin to increase rapidly and efficiency falls.

Most importantly, magnetic inductors are most typically fabricated by winding wire around a magnetic core. Wound magnetic inductors are bulky compared to components integrated on a semiconductor chip. Market demands for consumer electronics are driving component suppliers to create the thinnest and smallest devices possible. For battery-operated devices, the height of the electronic components mounted in the internal printed circuit board (PCB) is usually limited by the thickness of the inductors used for DC-DC power conversion. In addition, as discussed above, wound magnetic inductors are best suited for operation at frequencies of a few MHz or below. The capacitor $C_{out}$ of FIG. 2 acts with the output inductor $L_{out}$ to filter the output voltage. In order to ensure minimal output ripple, the capacitance must have a large enough value to store the time-varying charge delivered during the switching cycle without significant variation in the voltage across the capacitor. For converters operating at 10 MHz or less, the capacitor is typically 5 µF or larger, again adding substantially to the size and expense of the converter. Additionally, a capacitor is needed at the input of the converter, which is somewhat larger, or somewhat smaller in value compared with the output capacitor. For example, 0.5 times to 2 times the value of the output capacitor.

From equation (3) and FIG. 4, it is apparent that the size of the inductor can be reduced if the switching frequency is increased. Values of a few tens of nH can be considered for switching frequencies in the tens to hundreds of MHz. As an ancillary benefit, the required filter capacitor values are also reduced. The use of lower-valued inductors allows use of planar geometries that can be integrated on printed-circuit boards or fabricated in integrated circuits. While magnetic materials may still be employed, their deposition requires additional process steps and thus adds cost. At increasing switching frequency, most magnetic materials have reduced permeability and increased losses, though the exact behavior varies widely depending on the material and fabrication techniques employed. Therefore it is of interest to combine high-frequency switching with non-magnetically-enhanced inductors to realize compact, efficient switched mode DC-DC converters.

Increasing the switching frequency to 10 to 100 MHz or higher, while maintaining high efficiency, requires that losses within the switches be minimized. Switching losses arise from two independent sources, depicted in a simplified fashion in FIG. 5. The switch voltage and current are depicted qualitatively versus time in 110. During the time when a switch is open (in the case of a transistor, the applied gate voltage is such as to eliminate the conductive channel), it sustains a substantial voltage but very little current flows through it, so losses are negligible. Similarly, when the switch is closed (when the gate voltage is set so as to enhance channel conductivity), large currents flow but relatively little voltage appears across the switch (due to the supposedly low transistor on-resistance RON), so losses are again low. However, during the time $T_{sw}$ when the transistor transitions from the open to closed state, or vice versa, large voltages and currents may be simultaneously present, and losses can be substantial due to power being dissipated across the switching devices. These losses are on the order of the product of operating current, voltage, and switching time, and occur twice each cycle. For a buck converter with symmetrical switching of the series and shunt transistors, and a simple linear dependence of the current and voltage on time, we have:

$$P_{switch} \approx \frac{2}{3} I_{out} V_{max} T_{sw} f_s \quad (5)$$

where $P_{switch}$ is the power dissipated by the two switching transistors when switching at frequency $f_s$, $T_{sw}$ is the time required for the transistor to switch on or off, and $V_{max}$ is the voltage present on the switch in the open state immediately prior to closing, or just after opening. For a fixed switching time $T_{sw}$, these losses increase with switching frequency $f_s$.

Secondly, the voltage on the gate of a transistor must be changed in order to switch its state from open to closed or closed to open. In order to change the voltage, a quantity of charge proportional to the capacitance $C_{gate}$ of the transistor must be added to or removed from the gate by the driver circuitry 130. Charging the gate capacitance to a voltage $V_{gate}$ through a resistive series element requires an energy 120 of $C_{gate}V_{gate}^2$, which must be supplied for each switching cycle; this energy is lost when the charge ultimately finds its way to ground (unless some sort of charge recycling is used), resulting in a minimum dissipation proportional to frequency for each switching transistor:

$$P_{gate} = C_{gate} V_{gate}^2 f_{sw} \quad (6)$$

Prior art solutions to the problem of dissipation within the transistor channel during switching at high frequencies have been directed towards minimizing the drain-source voltage $V_{max}$. In the limit where the voltage across each transistor is 0 at the time when the state of the transistor is changed, little or no power is dissipated during the switching event. This condition is known as soft-switching or zero-voltage switching (ZVS). (Analogous approaches exist for switching at zero current through the switching device, known as Zero Current Switching, and offering similar benefits and challenges.) An example of the control timing used in this approach is shown in FIG. 6, with a typical prior art circuit shown in FIG. 7.

Zero-voltage switching depends on the use of a non-overlap or dead time during which both the series and shunt switches are off, such as time intervals 206 and 207. During this time, current into or out of the node $V_{sw}$ continues to flow due to the large inductor $L_{out}$, causing the node voltage 208 to change. When the series switch control voltage 201 goes high to turn the series switch $Q_{series}$ off, the node voltage 208 falls; if the shunt switch control voltage 202 goes high just as the voltage 208 crosses 0, little or no voltage is present between the transistor drain and source at the moment of switching, and switching loss is reduced. However, in dead time 207, when the shunt switch is turned off under normal low-ripple operation, the node voltage again falls, increasing the voltage presented to the series switch. In order to achieve ZVS on both switching elements, it is necessary that the inductor ripple current exceed the average current, so that current flows into the $V_{sw}$ node during the portion of the switching cycle 205, when the shunt switch control 202 has gone low but the series switch control 201 is still high. The node voltage 208 will then rise as current flows into the node; when the node voltage equals that supplied to the series switch, the series switch control voltage 201 goes low, so that turn-on of the series transistor $Q_{series}$ also occurs at near zero voltage across the transistor, minimizing loss therein. The rate at which the voltage $V_{sw}$ varies during the time both switches are off is determined by the ratio of the node current and capacitance. The node capacitance may intrinsically be very small, causing rapid changes in voltage and making it difficult to maintain correct switch timing, so it is typical to add capacitance to the node or in parallel with the switching transistors, depicted in FIG. 7 as $C_{series}$ and $C_{shunt}$, to simplify the problem of accurate switch timing.

To minimize dissipation due to switching of the capacitive load presented by the switching transistors, prior art work has focused on designs that store the gate capacitor switching energy in additional inductive elements, forming a resonant converter (FIG. 8). As is well-known, series resonant circuits can maintain large voltages across the individual elements with very low loss if the ratio of reactance to resistance of each element is large. However, such circuitry operates optimally only over a narrow band of frequencies and presents substantially sinusoidal voltages to the constituent components, so pulse-width modulation (PWM) cannot generally be used to control the output voltage, and other means such as frequency variation or on-off control must be substituted. Finally, the use of a resonant input may lead to large voltage swings on the switching transistor gates in order to ensure fast switching transients, which can cause reliability problems.

An alternative approach to minimizing both sources of switching loss is to employ very fast switching times, thus reducing the term $T_{sw}$ in equation (5). The time required to switch the transistor should be a small fraction of the switching control period. For operation at 100 MHz, where the switching control period is 10 nsec, the time $T_{sw}$ for a sinusoidal voltage (appropriate for use in a ZVS converter) is about 1.6 nsec. In order to achieve comparable switching dissipation when switching at a finite voltage, the switching time $T_{sw}$ should be no more than about ⅕ of this time, or 350 psec.

Advanced transistors using very short channel lengths and very thin oxides, with reduced area consumption and lower turn-on voltages, are necessary to implement such fast switching times. By using such technologies, capacitance is minimized (for the same RON) and the voltage required to change the transistor state is reduced, and thus gate switching loss is also reduced. Table 1 summarizes typical values of some key figures of merit for CMOS technologies as a function of technology generation (expressed as the minimum feature size $L_{min}$). It is clear that for more advanced technology generations, the energy needed to charge a unit gate area to the maximum allowed voltage falls precipitously, reducing the gate switching loss. (The simple figure of merit shown here underestimates the resulting benefit, because the area required to achieve a given on resistance also falls for smaller feature sizes.) The minimum delay also falls, and thus the product of the time needed to change the state of a switch and the switching frequency, which determines the channel switching loss, falls from a substantial value of 12% for 0.5 micron transistors, to a negligibly small value of 1.5% for 65 nm structures.

TABLE 1

Key converter parameters for different generations of silicon CMOS fabrication technology.

| Lmin | Cgate | Kn | Vmax DC | Vt | Minimum delay | Gate energy | $2T_{sw}$ *$f_{sw}$ |
|---|---|---|---|---|---|---|---|
| 0.5 | 3 | 60 | 5 | 1 | 94 | 37.5 | 7.5% |
| 0.35 | 5 | 80 | 3.3 | 1 | 100 | 27.2 | 8% |
| 0.25 | 6 | 100 | 2.7 | 0.8 | 59 | 21.9 | 4.7% |
| 0.18 | 8 | 130 | 1.8 | 0.65 | 52 | 13.0 | 4.2% |
| 0.13 | 9 | 150 | 1.3 | 0.55 | 41 | 7.6 | 3.2% |
| 0.09 | 10 | 160 | 1.1 | 0.45 | 23 | 6.1 | 1.9% |
| 0.065 | 10 | 160 | 1.1 | 0.4 | 11 | 6.1 | 0.9% |

TABLE 2

Explanation of the parameter names used in Table 1.

| Parameter | Description | Units |
|---|---|---|
| Lmin | Minimum dimension characteristic of a given technology generation. | microns |
| Cgate | Gate capacitance of the standard MOS transistor. | fF/μm² |
| Kn | Transconductance parameter of NMOS device. | μA/V² |
| Vmax DC | Maximum allowed value of Vgs or Vds, measured at DC | V |
| Vt | Threshold voltage of MOS transistor. | V |
| Delay | Characteristic delay for matched inverters (ring oscillator), estimated as $$T_{switch} \approx \frac{2\beta L_{min}^2}{\mu_n(V_{max\,DC} - V_t)}$$ where $\mu_n$ is the electron mobility estimated from the measured gate capacitance and transconductance parameter, and □ is an empirical constant adjusted to agree with simulation results at Lmin = 0.18 micron. | Ps |
| Gate energy | Energy to charge 1 square micron gate to Vmax | fJ |
| 2Tsw*fsw | Relative percentage of the switching period devoted to actual transitions, estimated as [2 * (switch transition time * 100 MHz)], assuming a 4x tapered buffer. | % |

However, it can be observed that the maximum allowable DC voltages are also decreased, and in fact previously reported input voltage for single-switching-transistor converters is shown as a function of the technology used in FIG. 9. It is apparent that for CMOS devices with critical dimensions of 180 nm and below, the input voltage will fall below commonly-encountered supply voltages, such as 3.0, 3.6, and 5 volts, of importance in portable device applications. Under these conditions, a conventional buck converter circuit as depicted in FIG. 2 cannot operate reliably.

Therefore, there exists a need for a DC-DC converter that is simultaneously compact (including optimally fabrication of all active and passive components on a single semiconductor die), low in cost, and highly efficient even at small ratios of output to supply voltage and low output current.

It is desirable to have a method and apparatus for protecting switching elements of a converter from transient voltages to allow fast low-loss switching operations without degradation of reliability.

SUMMARY

An embodiment includes a voltage regulator. The voltage regulator includes regulator circuitry for generating a regulated voltage from a first power supply and a second power supply, and voltage spike protection circuitry for voltage-spike-protecting the regulator circuitry, wherein the voltage spike protection circuitry includes a dissipative element and a charge-storage circuit.

Another embodiment includes a method of generating a regulated voltage. The method includes regulator circuitry generating a regulated voltage from an input voltage, and voltage-spike-protecting the regulator circuitry with voltage spike protection circuitry, wherein the voltage spike protection circuitry includes a dissipative element and a charge-storage circuit.

Another embodiment includes a method of generating a regulated voltage. The method includes regulator circuitry generating the regulated voltage though controlled closing and opening of a series switch element and shunt switch element, wherein the series switch element is connected between a first voltage supply and a common node, and the shunt switch is connected between the common node and a second supply voltage. The method further includes closing the series switch element during a first period, and closing the shunt switch element during a second period, wherein the series switch element and the shunt switch element form switching blocks, and each switching block includes a plurality of switching block segments. The method further includes voltage-spike-protecting the regulator circuitry with voltage spike protection circuitry, wherein the voltage spike protection circuitry includes a dissipative element and a charge-storage circuit.

Other aspects and advantages of the described embodiments will become apparent from the following detailed description, taken in conjunction with the accompanying drawings, illustrating by way of example the principles of the described embodiments.

DETAILED DESCRIPTION

The described embodiments include provisions for protection of the switching elements of the converter from transient voltages to allow fast low-loss switching operations without degradation of reliability. Other embodiments include methods for selecting the timing of the control inputs to the switching elements of the DC-to-DC converter so as to allow recapture of stored charge and minimal switching losses, without the requirement for addition of capacitance to the switched nodes.

Figure 1:
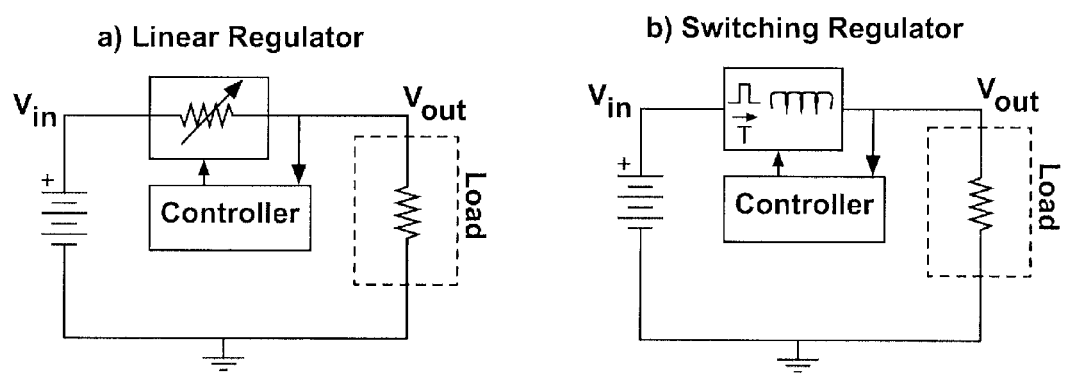
FIG. 1 shows an example of prior art linear voltage regulator and a prior art switching mode voltage regulator.
Figure 2:
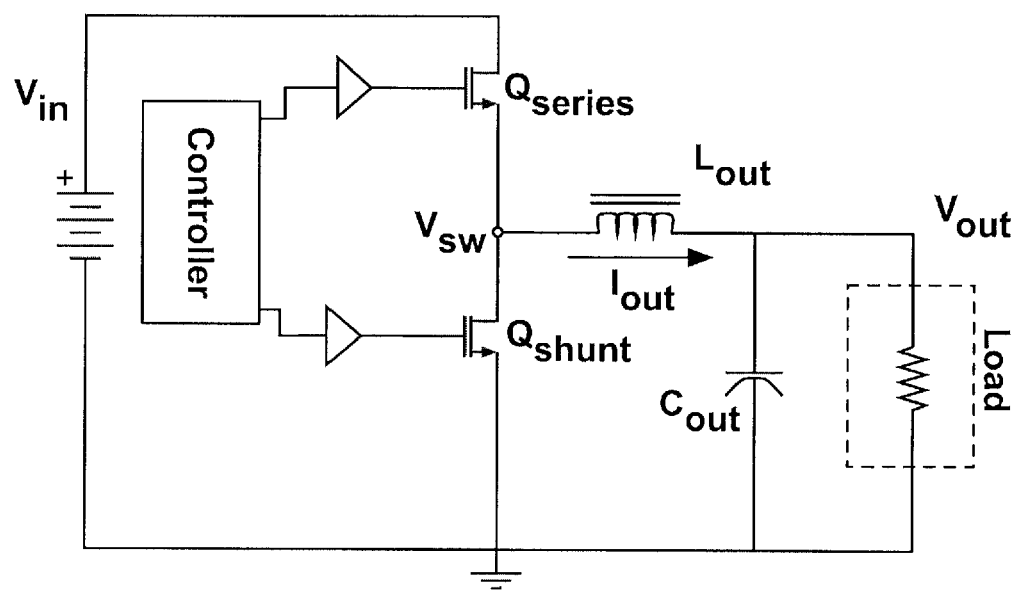
FIG. 2 shows an example of a prior art buck switching mode voltage regulator.
Figure 3:
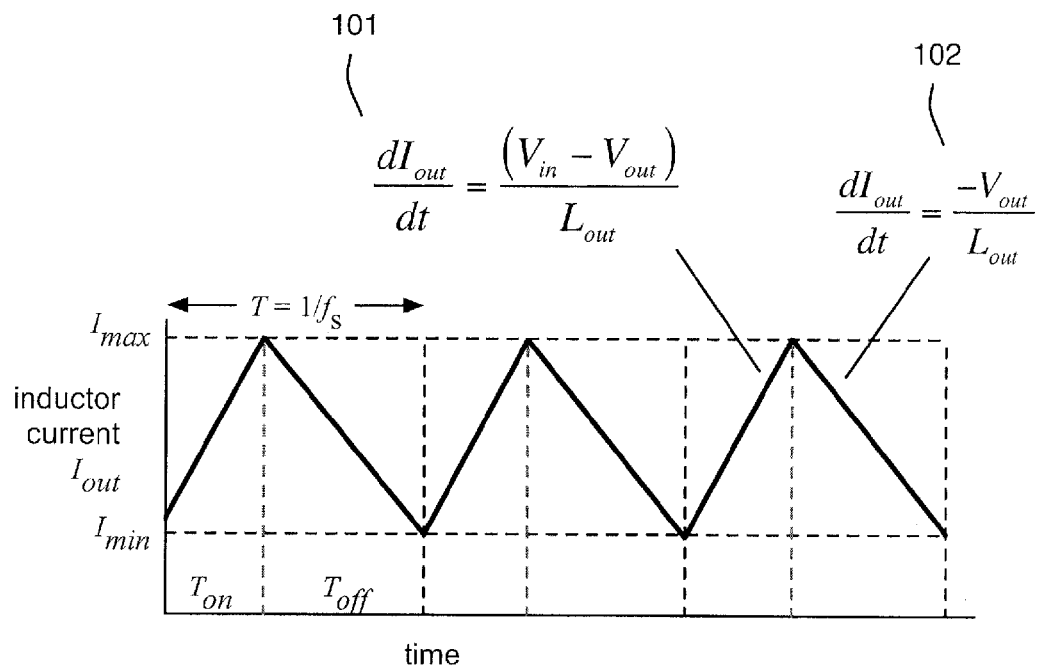
FIG. 3 is a time-line that shows current of an output main inductor.
Figure 4:
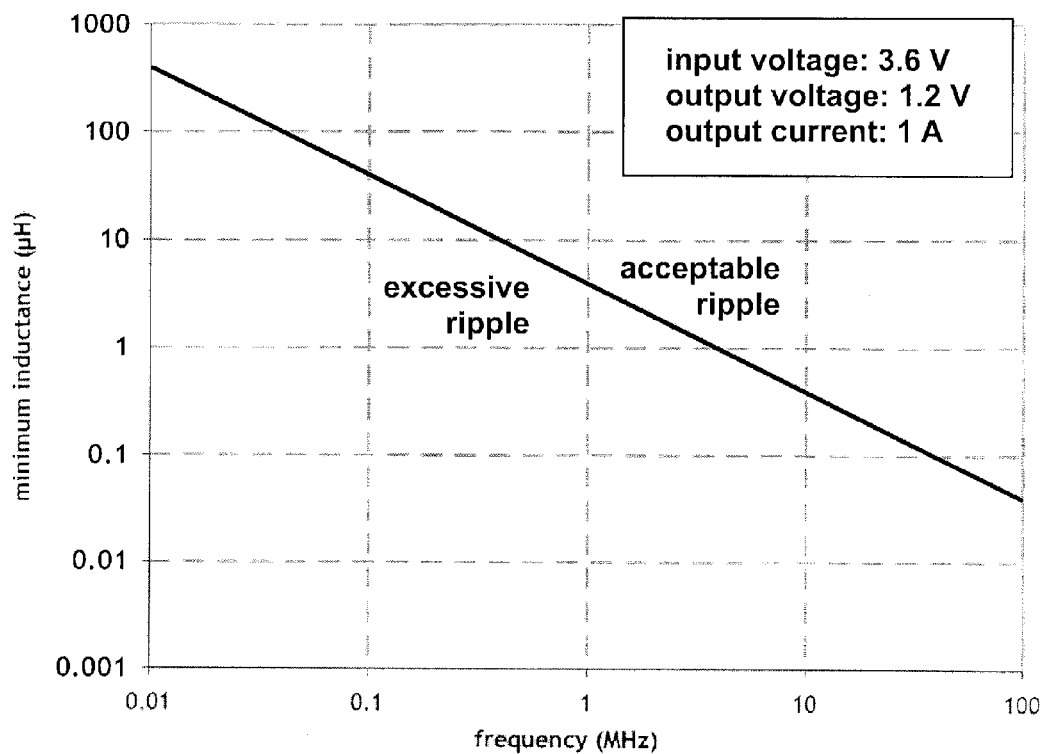
FIG. 4 shows estimated values of minimum inductance of a switching mode voltage regulator required as a function of switching frequency.
Figure 5:
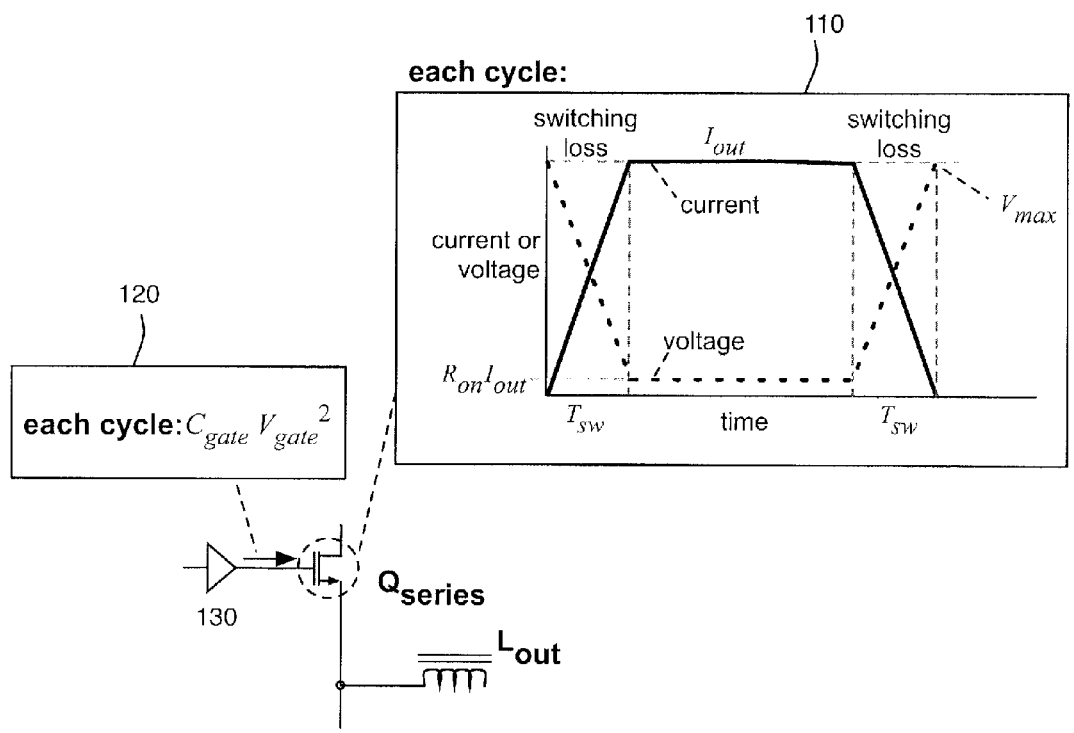
FIG. 5 is a time-line that shows an example of switching loss in a typical transistor due to gate charging energy and transient dissipation in a conductive channel.
Figure 6:
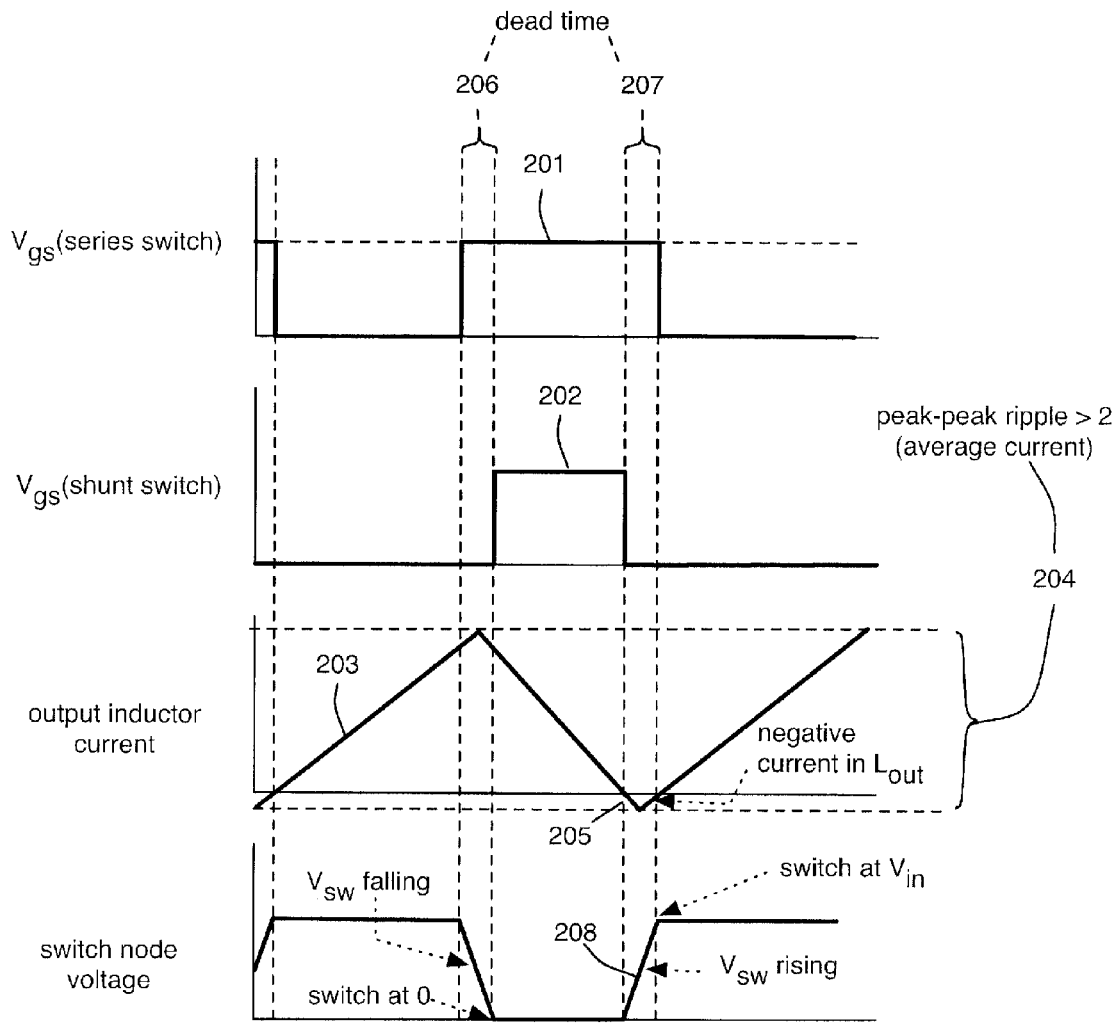
FIG. 6 shows time-lines of voltage and current waveforms of Zero-Voltage Switching buck converter.
Figure 7:
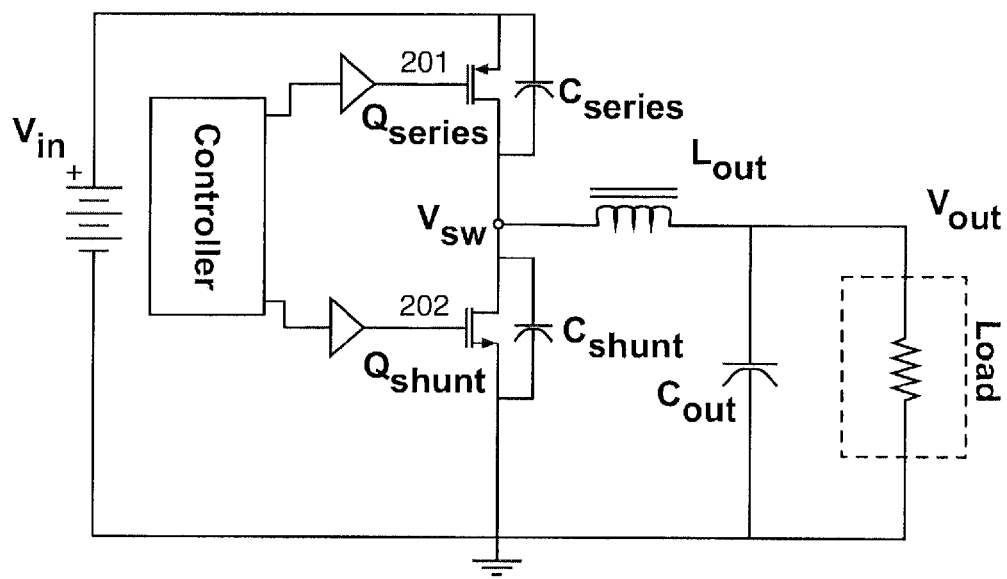
FIG. 7 shows an example of an implementation of a zero-voltage-switched buck converter that includes additional capacitance shunting switching transistors.
Figure 8:
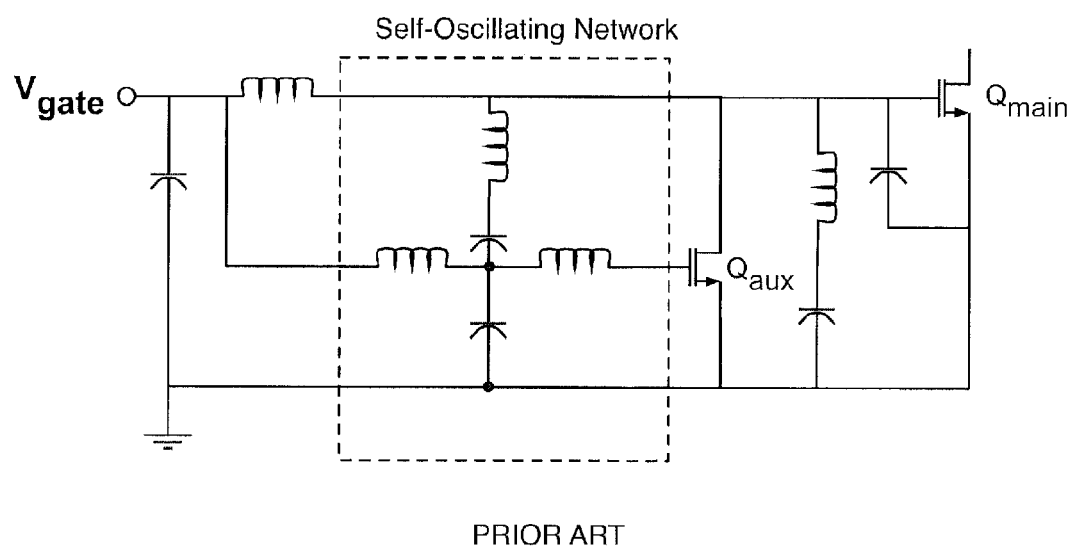
FIG. 8 shows an example of a resonant gate circuit that uses inductive elements to minimize switching energy and maximize switching voltage.
Figure 9:
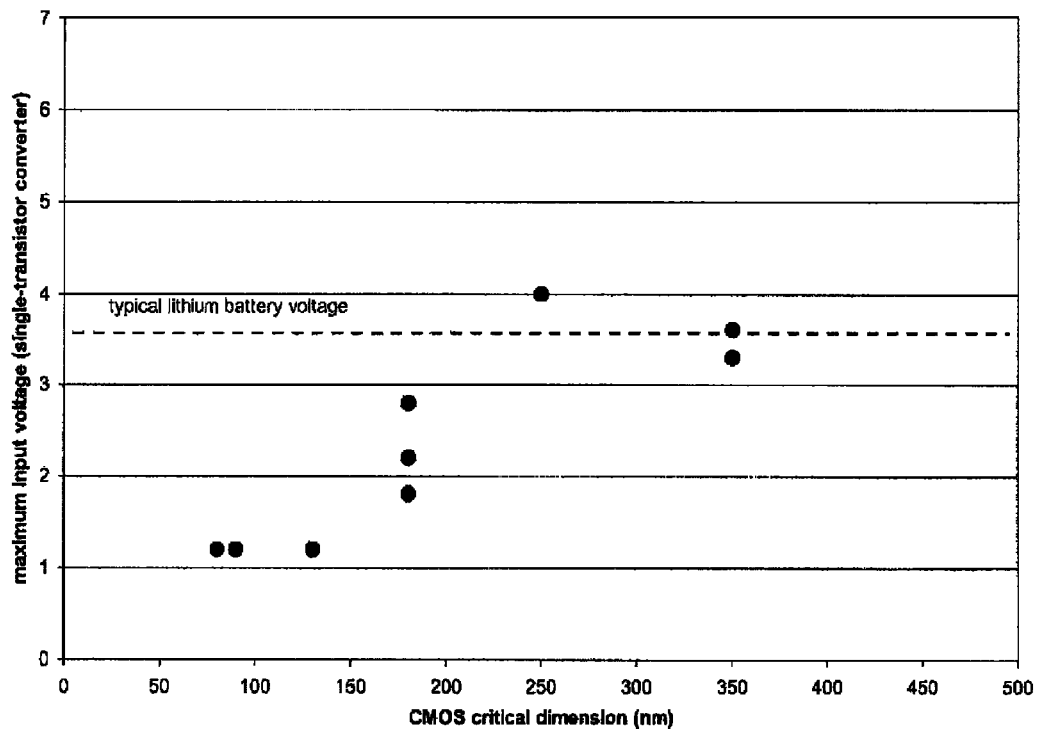
FIG. 9 is a plot that shows maximum reported operating voltage for single-transistor converters using CMOS technologies.
Figure 10:
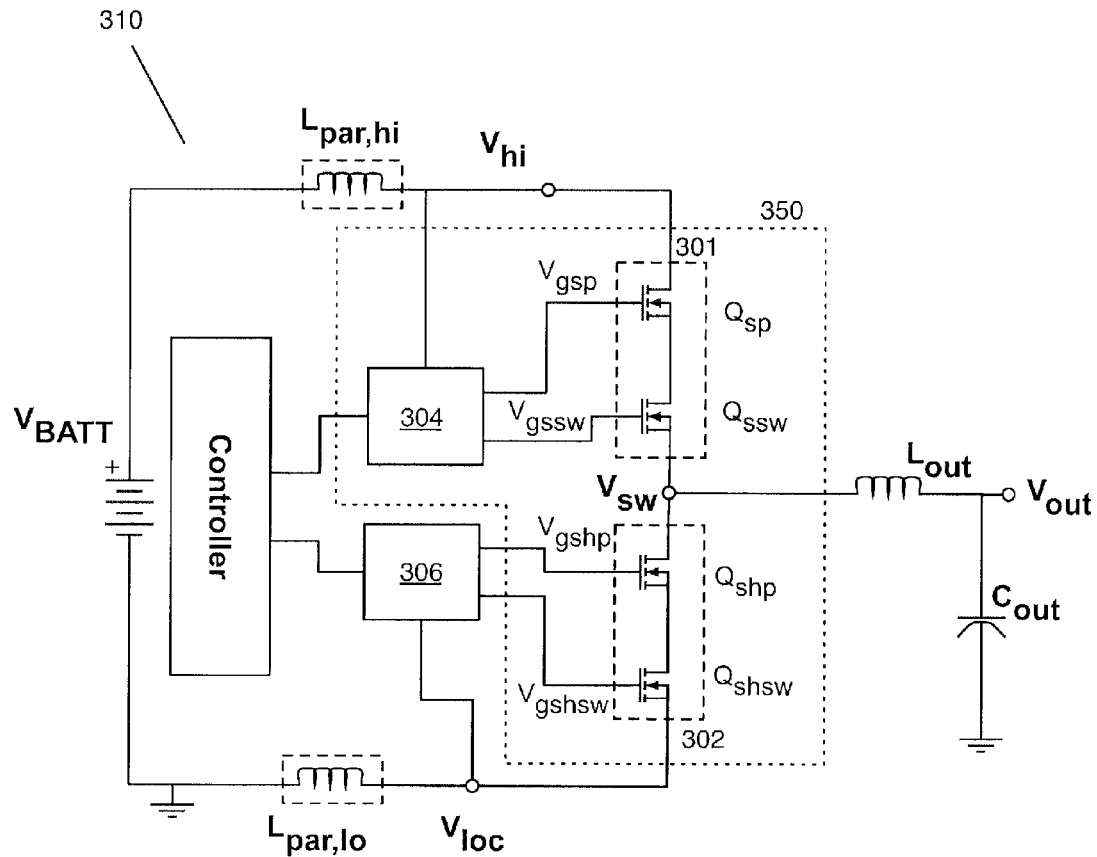
FIG. 10 shows an example of a switching mode voltage regulator.

FIG. 10 shows an example of a voltage converter 310 that includes at least some of the elements of the described embodiments. The converter 310 includes a series switching element 301 and a shunt switching element 302, each implemented with stacked transistors. An embodiment of the series switch element 301 includes an N-type metal oxide semiconductor (NMOS) series switching transistor $Q_{ssw}$ stacked with an NMOS series protection transistor $Q_{sp}$, and an embodiment of the shunt switching element 302 includes an NMOS shunt switching transistor $Q_{shsw}$ stacked with an NMOS shunt protection transistor $Q_{shp}$. A dashed block section 350 of FIG. 10 depicts the stacked NMOS transistor $Q_{ssw}$, $Q_{sp}$, $Q_{shsw}$, $Q_{shp}$, of the series and shunt elements 301, 302, and driver and a floating power supply 304 that controls gate voltages of the NMOS transistors $Q_{ssw}$, $Q_{sp}$, of the series switch element 301.

A controller provides switching control signals that control the timing of opening and closing of the series switch element 301 and the shunt switch element 302. This embodiment of the converter 310 further includes a driver and floating power supply 304 (also referred to as a bootstrap circuit) configured to provide control inputs and bias inputs to the switching and protection transistors, respectively, of the series switch element 301, voltages therein being referenced to the time-dependent value of the output switching node $V_{sw}$.

As will be shown and described, a method of generating a regulated voltage includes generating the regulated voltage though controlled closing and opening of the series switch element 301 and shunt switch element 302. As shown in FIG. 10, the series switch element is connected between a first voltage supply (shown as $V_{hi}$ in FIG. 10) and a common node (depicted as the output switching node having a voltage potential of $V_{sw}$), and the shunt switch element 302 is connected between the common node and a second supply voltage (shown as $V_{loc}$ in FIG. 10).

The method of generating the regulated voltage includes closing the series switch element 301 during a first period. The closing of the series switch element 301 includes applying a switching gate voltage $V_{gssw}$ to a gate of the NMOS series switch transistor $Q_{ssw}$ of the series switch element 301, wherein the switching gate voltage $V_{gssw}$ has a voltage potential of at least a threshold voltage greater than a voltage potential ($V_{SW}$) of the common node. Further, the method of generating the regulated voltage includes closing the shunt switch element 302 during a second period. As previously mentioned, the shunt switch element 302 includes the NMOS shunt switching transistor $Q_{shsw}$ stacked with the NMOS shunt protection transistor $Q_{shp}$.

As will be described, closing the series switch element 301 during the first period further includes applying a second switching gate voltage $V_{gsp}$ to the NMOS series protection transistor $Q_{sp}$, wherein the second switching gate voltage $V_{gsp}$ has a voltage potential of less than the first supply voltage plus a maximum DC (direct current) voltage rating of the NMOS series switching transistor, and greater than the voltage potential of the first voltage supply plus the threshold voltage. For the purposes of the discussion here, the threshold voltage is the voltage applied to the gate of the corresponding NMOS transistor that causes the transistor to conduct current.

Closing of the shunt switch element 302 during the second period includes applying a switching gate voltage $V_{gshsw}$ to a gate of the NMOS shunt switch transistor $Q_{shsw}$ of the shunt switch element 302, wherein the switching gate voltage $V_{gshsw}$ has a voltage potential of at least a threshold voltage greater than a voltage potential of the second supply voltage. Closing the shunt switch element 302 of the second period further includes applying a second switching gate voltage $V_{gshp}$ to a gate of the NMOS shunt protection transistor $Q_{shp}$ of shunt switch element 302, wherein the second switching gate voltage $V_{gshp}$ has a voltage potential of less than the second supply voltage plus a maximum DC (direct current) voltage rating of the NMOS series switching transistor, and greater than the voltage potential of the first voltage supply minus the maximum DC (direct current) voltage rating of the NMOS series switching transistor.

An embodiment includes a difference between the voltage potential of the first voltage supply and the second voltage supply is limited to the sum of maximum DC (direct current) voltage rating of the NMOS series switching transistor and the NMOS series protection transistor.

Figure 11:
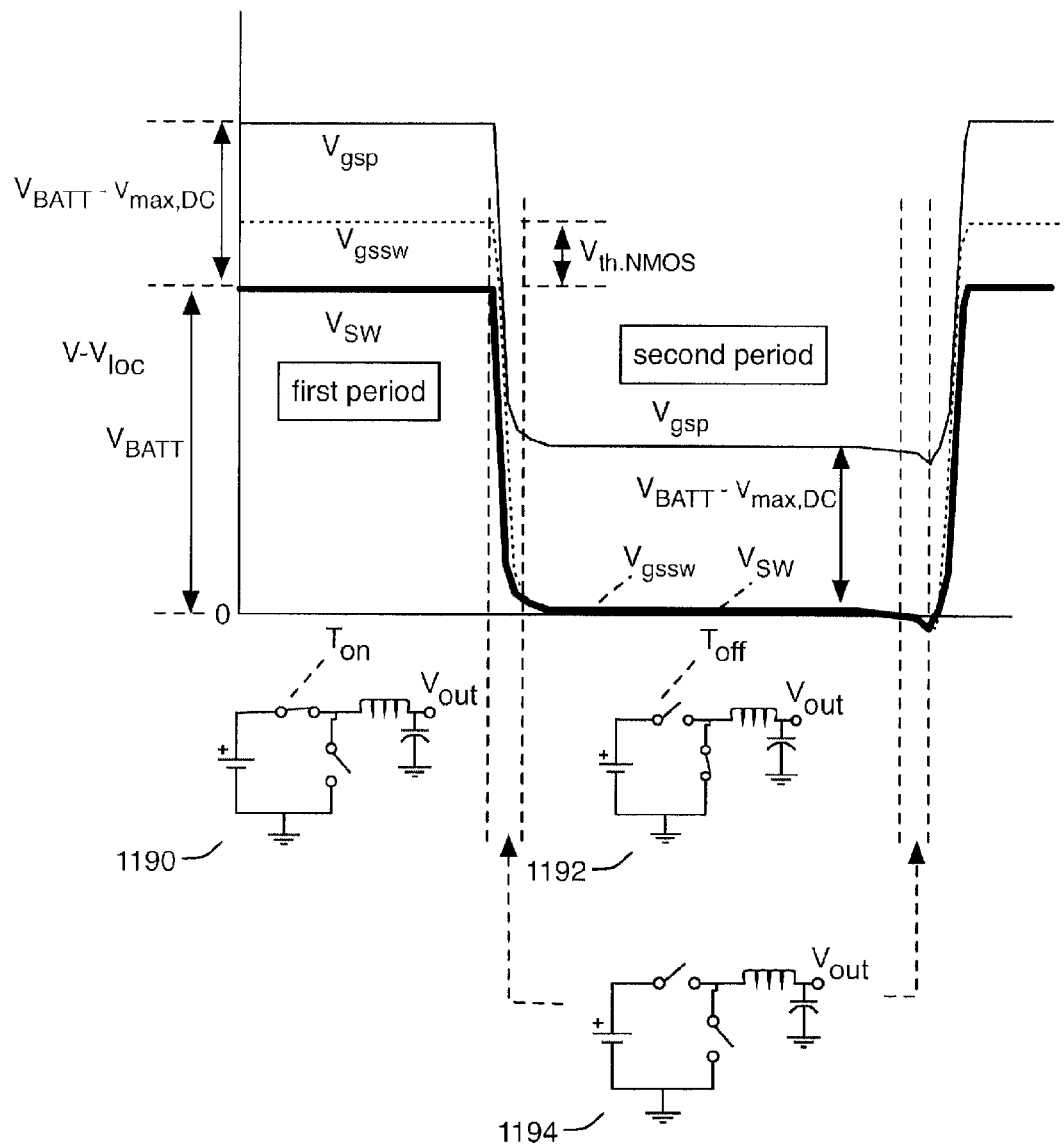
FIG. 11 shows an example of a time-line of the switching voltage $V_{sw}$ of the common node, and the associated gate voltages of the series switching block.

FIG. 11 shows an example of a time-line of the switching voltage ($V_{sw}$, also referred to as the voltage potential of the common node, and the associated gate voltages of the series switching block 301. A simplified series of regulator circuit representations 1190, 1192, 1194 are provided along with the time line for depiction of the states (open or closed) of the series switch element 301 and the shunt switch element 302 over the switching periods shown in the time-line.

As shown, during the previously described first period (series switch element 301 closed, shunt switch element 302 open as depicted by regulator circuit representation 1190), the switching voltage ($V_{sw}$) has a voltage of approximately $V_{BATT}$. Additionally, as shown, the gate voltage $V_{gssw}$ (also referred to as the switching gate voltage) of the gate of the NMOS series switch transistor $Q_{ssw}$ of the series switch element 301 has a voltage potential of $V_{BATT}$ plus a threshold voltage (Vth). It should be observed that the voltage potential of the gate voltage $V_{gssw}$ is greater than the voltage potential $V_{BATT}$, thereby requiring circuitry within the driver and floating power supply 304 to provide this voltage potential. Further, the gate voltage $V_{gsp}$ (also referred to as the second switching voltage) of the gate of the NMOS series protection transistor of the series switching block 301 has a voltage potential of $V_{BATT}$ minus a voltage $V_{max,DC}$, wherein $V_{max,DC}$ is a maximum DC voltage that can be applied across the drain to source of the NMOS transistors without destroying the transistors.

During a transition period between the first period and the second period, both the series switch element 301 and the shunt switch element 302 are open as depicted by the regulator circuit representation 1194. During the previously described second period, (series switch element 301 open, shunt switch element 302 closed as depicted by regulator circuit representation 1192), the switching voltage ($V_{sw}$) has decayed to a voltage potential of approximately zero volts. Note that the switching voltage ($V_{sw}$) will fall when both series switch and shunt switch are both open, as well as when only shunt switch is closed. Additionally, as shown, the gate voltage Vgssw of the gate of the NMOS series switch transistor of the series switch element 301 has a voltage potential of approximately the switching voltage ($V_{sw}$). Further, the gate voltage Vgsp (also referred to as the second switching voltage) of the gate of the NMOS series protection transistor $Q_{sp}$ of the series switching block 301 has a voltage potential of approximately $V_{BATT}$ minus the voltage $V_{max,DC}$.

Figure 12:
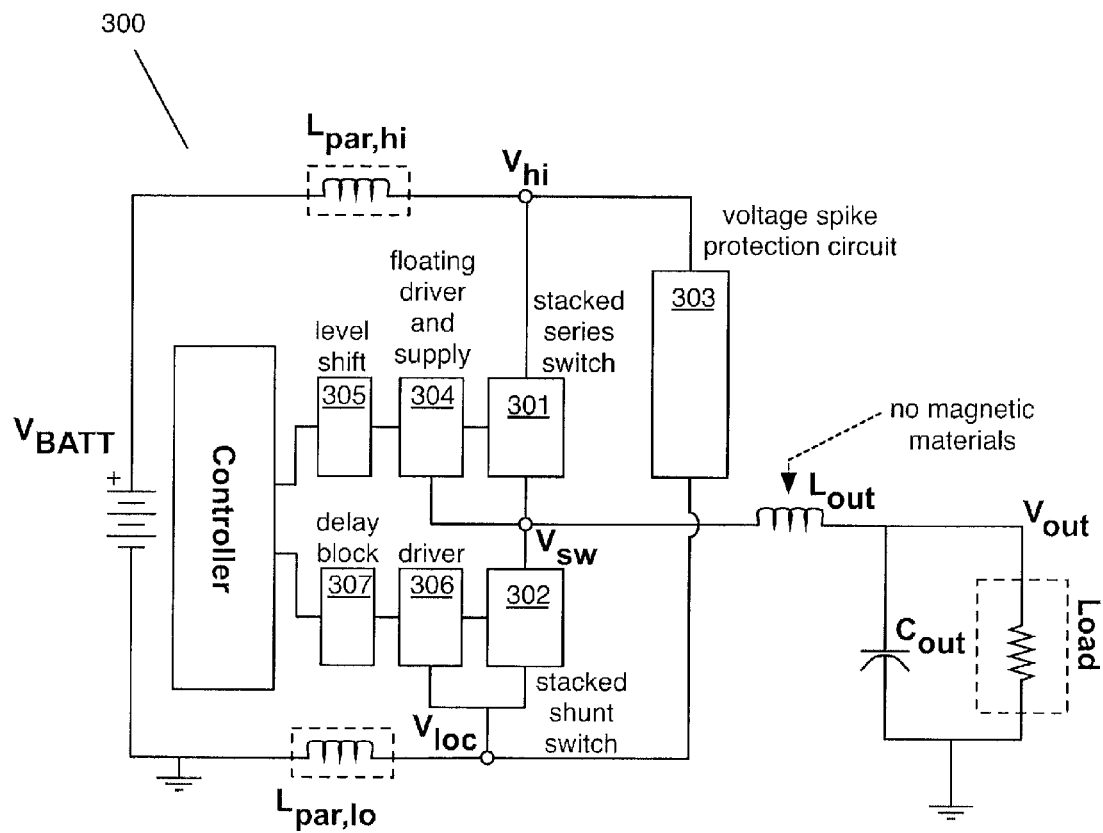
FIG. 12 shows an example of a more detailed implementation of a voltage converter.

FIG. 12 shows an example of a more detailed implementation of a voltage converter 300. As shown, the voltage converter 300 can additionally include an ultra-low-parasitic inductance on-chip voltage spike protection circuit 303 to enable fast, low-loss switching. As shown, the converter 300 can additionally include a level shifting circuit 305 to translate the signals from the controller, which reference the local ground potential $V_{loc}$, to equivalent signals referenced to the time-dependent value of the output switching node $V_{sw}$. This converter 300 further includes driving circuitry for the shunt switching and protection transistors, consisting of a delay block 307 with circuitry presenting substantially identical time delays to the level shift block 305 without inducing a shift in DC levels, and a tapered driver 306 providing control signals to the series switch with substantially identical time delays to those of the floating driver 304 for the series switch.

Figure 13:
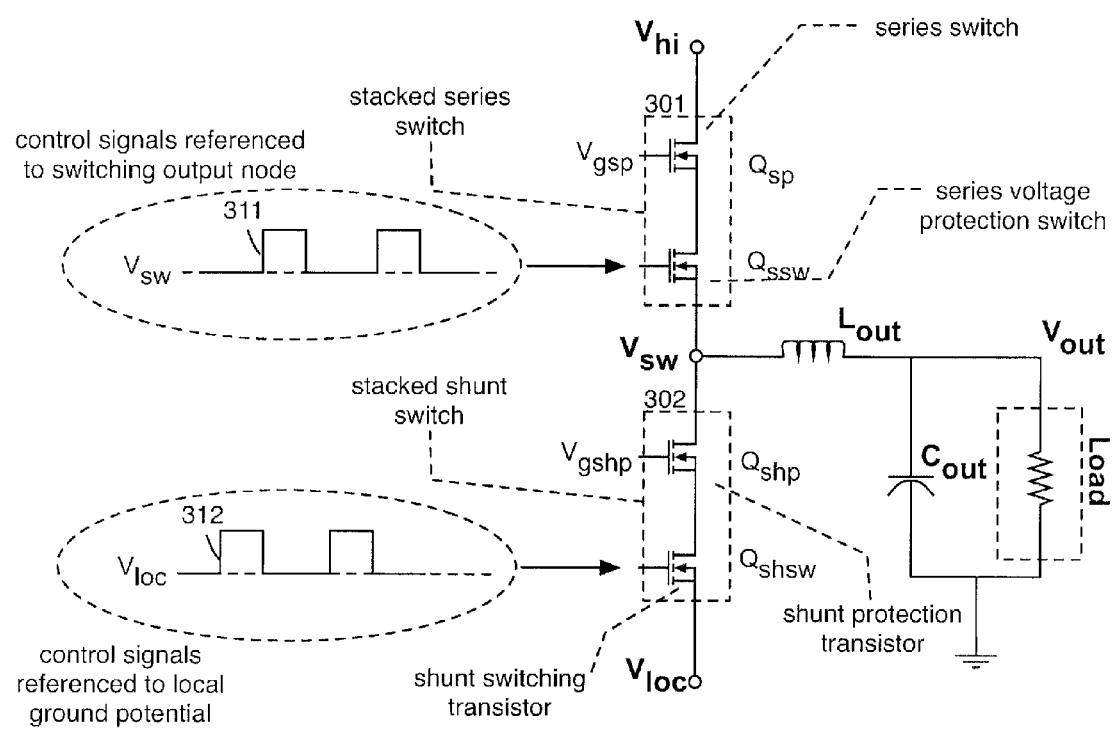
FIG. 13 shows an exemplary embodiment of a stacked series switch element and a stacked shunt switch element.

FIG. 13 shows an exemplary embodiment of the stacked series switch element 301 and the shunt switch element 302. As shown, each switching block 301 and 302 includes two transistors, a switching transistor and a protection transistor, and is suitable for operation with supply voltages of roughly twice the maximum DC drain-to-source voltage allowed for the transistor technology in use. While the stacked series switch element 301 and the shunt switch element 302 are shown with only two transistors, it is to be understood that other implementations can include more than two transistors within the stacked series switch element 301 and the shunt switch element 302 while maintaining equivalent functionality.

Focusing attention first on the shunt switching block 302, the exemplary embodiment includes two NMOS transistors $Q_{shsw}$ and $Q_{shp}$ in series, being respectively the switching and protection transistors. It is important to note that, as indicated by the schematic diagrams, these transistors are configured so that the local body contact is held at the same potential as the source of the transistor. In the case of $Q_{shsw}$ this potential is the same as the local ground potential $V_{loc}$, and this transistor may be fabricated within a local well or in the bulk material, but the protection transistor or transistors $Q_{shp}$ must be fabricated within a well and with the local potential of that well tied to the potential of the transistor source contact, in order to avoid excessive voltages between the gate contact and the transistor body contact. In an embodiment each transistor is fabricated within its own p-well placed inside an n-doped isolation region, but in an alternative embodiment both transistors may be fabricated in isolated p-doped wells within a larger n-doped well, wherein the larger n-doped well is tied to a higher input voltage (generally $V_{hi}$). Note that the junction between the well and the bulk-doped background region is typically low-doped and can tolerate much larger voltages than the transistor terminals without avalanche breakdown occurring. Other embodiments can include, for example, dielectrically isolated transistors to accomplish the same goal.

The control voltages 312 provided to the switching transistor $Q_{shsw}$ are referenced to a local ground potential and may be provided by a conventional tapered buffer amplifier referenced to local ground, except as described below in connection with management of delays within the buffer. The gate bias voltage $V_{gshp}$ provided to $Q_{shp}$ is selected to avoid excessive voltage stress to the switching transistor.

Figure 14:
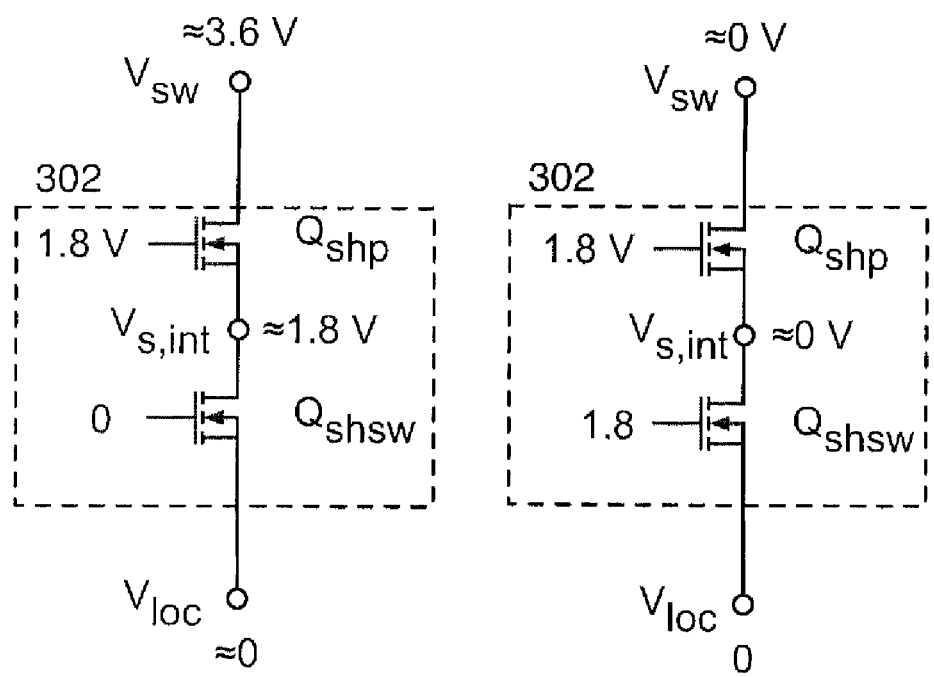
FIG. 14 shows exemplary biasing conditions for shunt switching and protection transistors.

FIG. 14 shows exemplary biasing conditions for shunt switching and protection transistors. The example of FIG. 14 is for the case in which the supply voltage is approximately 3.6 V, and transistors with a threshold voltage of approximately 0.5 V, and maximum gate-source, gate-drain, and drain-source voltage of 1.8 V are employed for $Q_{shp}$ and $Q_{shsw}$. When the series switch 301 is on and the shunt switch 302 is off, referring to FIG. 14, it is apparent that the potential $V_{sw}$ will be approximately equal to the supply voltage (ignoring small corrections for the on-resistance of the series switch elements and other parasitic resistances, and time-dependent voltages to be examined in more detail below). The gate voltage provided to $Q_{shsw}$ is less than the threshold voltage, so that the shunt switch is off. By providing an intermediate value of DC voltage to the gate of the protection transistor, here shown as 1.8 V, the intermediate node $V_{s,int}$ between the switching and protection transistors is forced to adopt a potential of less than the threshold voltage when the lower switch transistor is OFF and approximately equal to the VMAX when the transistor is ON. Thus the voltages on the various nodes adjust themselves to as to avoid excessive voltage appearing between any two transistor terminals, and hot-carrier reliability remains acceptable.

Similarly, when the series switch 301 is off and the shunt switch 302 is on, the output voltage $V_{sw}$ is nearly 0, ignoring the small voltage drops due to transistor on-resistance. The voltage from the gate of the protection transistor $Q_{shp}$ to the source and drain is again within the limits of allowed voltage, ensuring acceptable resistance to time-dependent dielectric breakdown.

Note that in this circuit, and the shunt switch element as described below, it is possible to employ more than two transistors in series to operate with higher input voltages relative to the maximum acceptable voltage for a single transistor. However, in such a case, it is necessary to allow for a variation in the gate potential applied to the switching transistors. Because the magnitude of the voltage applied thereto is reduced, the additional energy supplied to the gates of these added protection transistors is small relative to that required for switching a single main transistor of similar capacitance.

Turning next to the series switch element 301, the exemplary implementation includes two NMOS transistors $Q_{ssw}$ and $Q_{sp}$ in series, being respectively the switching and protection transistors. Again note that, as indicated by the schematic diagrams, these transistors are configured so that the local body contact is held at the same potential as the source of the transistor. In the case of the series switching block 301, it is indispensable that all transistor body contacts be tied to the local source potential of the respective transistor, since the source potential references the output switching node potential $V_{sw}$, which swings from near local ground $V_{loc}$ to near local supply $V_{hi}$ as the state of the switches is varied.

In the case of the series switch element 301, the control voltage 311 applied to the gate of $Q_{ssw}$, and the bias voltage applied to the gate of $Q_{sp}$, must both be referenced to the output switching node potential $V_{sw}$. Thus, the difference between the potential $V_{g,sp}$ and the potential $V_{sw}$ is held constant despite variations in the value of $V_{sw}$ relative to local ground $V_{loc}$, and similarly the difference between the potential $V_{g,ssw}$ and $V_{sw}$ is held constant in a given control state despite variations in the value of $V_{sw}$ relative to local ground $V_{loc}$. That is, the bias and control voltages to the series switch must float relative to ground. A means for accomplishing this end in the exemplary embodiment is described in more detail below.

Note that it is possible to use PMOS transistors as the series switching and protection elements 301. In this case, the control and bias voltages are referenced to the local supply voltage $V_{hi}$, which does not vary significantly with respect to the local ground $V_{loc}$ during the switching cycle (ignoring parasitic effects and transient effects to be discussed in more detail below). When PMOS transistors are used for the series switching block 301, but the maximum gate-to-drain or gate-to-source voltage of the transistors used is substantially less than the supply voltage, it is still necessary to provide means for shifting the level of the control voltages relative to local ground, as will be described below for the exemplary implementation, but it is no longer necessary to arrange for floating supply voltage and driver voltages. However, the use of PMOS transistors instead of NMOS transistors suffers from several disadvantages. Minimization of transistor on resistance is particularly important in the case of a stacked switch block, since the output current must flow through two transistors in series, incurring dissipative losses in each. Because the hole mobility in silicon is substantially less than the electron mobility, the PMOS transistors must be much wider than NMOS devices to achieve equivalent ON resistance, and therefore the gate capacitance of the PMOS switches will be larger than that of comparable NMOS devices. Referring to equation 6, it is apparent that the gate switching loss will be increased in proportion to the gate capacitance, and therefore the efficiency of the converter will be impaired. In addition, the transient behavior of the PMOS devices during switching is different from NMOS devices, and varies differently with variations in process parameters during fabrication, and operating temperature and voltage, so that precise control of relative switching times of the series and shunt switching elements is more difficult to achieve, particularly at the high operating frequencies required to ensure the desired compact size and ready integration of the converter elements. Therefore the use of NMOS transistors in the series switch can be advantageous.

Bootstrapped Voltage Supply and Level Shifting Circuits

Figure 15:
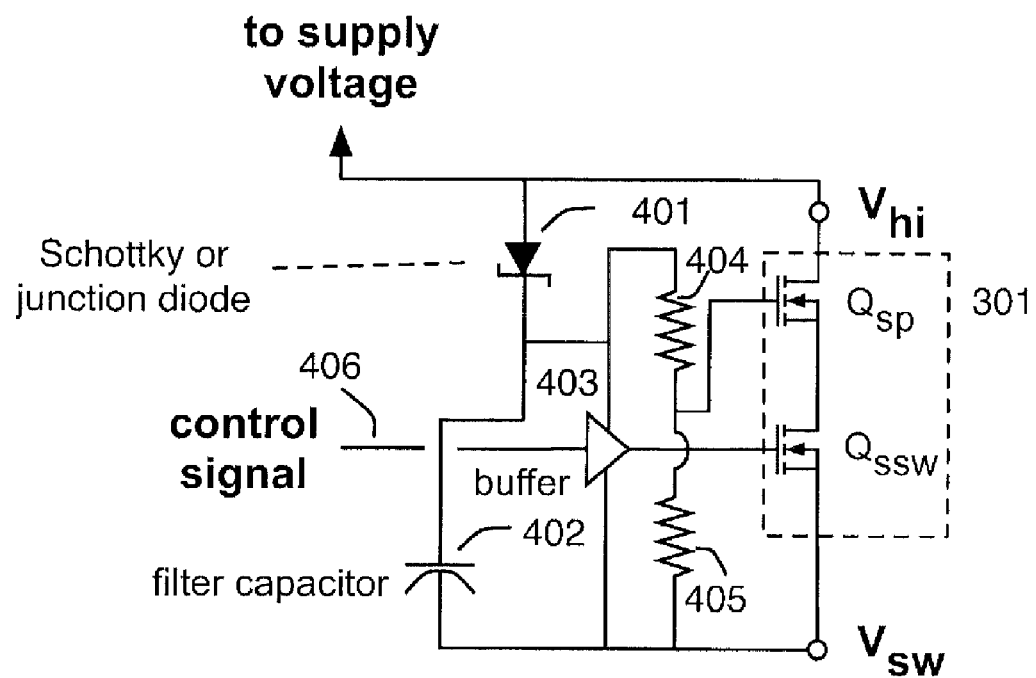
FIG. 15 shows an example of a conventional means of constructing a bootstrapped voltage supply.

The use of a stacked NMOS series switch 301 requires that the control voltage 311 to the series switching transistor, and the bias voltage $V_{gsp}$ to the series protection transistor, be referenced to the output switching node potential $V_{sw}$, as described above. A conventional means of construction of such a bootstrapped voltage supply is shown in FIG. 15. A diode 401 is used to connect a capacitor 402 to the positive supply voltage. When the floating node ($V_{sw}$ here) is pulled below the positive supply voltage, the diode 401 is forward-biased, and the capacitor 402 can be charged up to a potential equal to the difference between the supply voltage and the low value of the floating node, minus the turn-on voltage of the diode. When the floating node swings high, the diode 401 is reverse-biased, and the high side of the filter capacitor 402 is able to float to values higher than the supply potential, thus keeping the series switching transistors on during the appropriate part of the switching cycle. A resistive voltage divider 404/405 may be used, as shown in FIG. 15, to extract the desired bias voltage to be applied to the protection transistor $Q_{sp}$; a low-dropout regulator or a series diode circuit may also be employed for this purpose. In some embodiments the buffer can not swing "rail-to-rail", and needs to be reduced to a voltage range within the breakdown limits of the switch device.

The approach described above had several disadvantages. Schottky diodes on silicon are difficult to fabricate with acceptable performance, and thus are often unavailable or do not provide acceptable performance. A junction diode may be substituted for the Schottky diode. Junction diodes may be used in high-voltage, low-frequency systems. However, junction diodes are characterized by a finite response time, referred to as the reverse recovery time, during which current is conducted for an interval in the nominally-blocking direction after a forward-bias condition. (This results from the necessity of removing minority carriers from the junction regions that were injected during a previous period of forward current flow.) In the high-frequency converter of the described embodiments, this reverse recovery time is typically a substantial fraction of the total switching period, resulting in significant loss of charge and thus voltage from the filter capacitor. Thirdly, the supply voltage is not regulated, so that reliability may be impacted when a high-voltage source, such as a new battery, is encountered. Finally, the largest voltage that is available to be placed across the capacitor is the supply voltage minus the diode turn-on voltage, as noted above. Particularly in the case of a junction diode, the turn-on voltage may be as large as 0.85 V or more, representing a significant fraction of the supply voltage, impairing operation with batteries, especially when the input voltage has fallen due to discharge and/or aging. Thus, traditional bootstrapped voltage supplies have several significant disadvantages when used with the high-frequency regulator.

Figure 16:
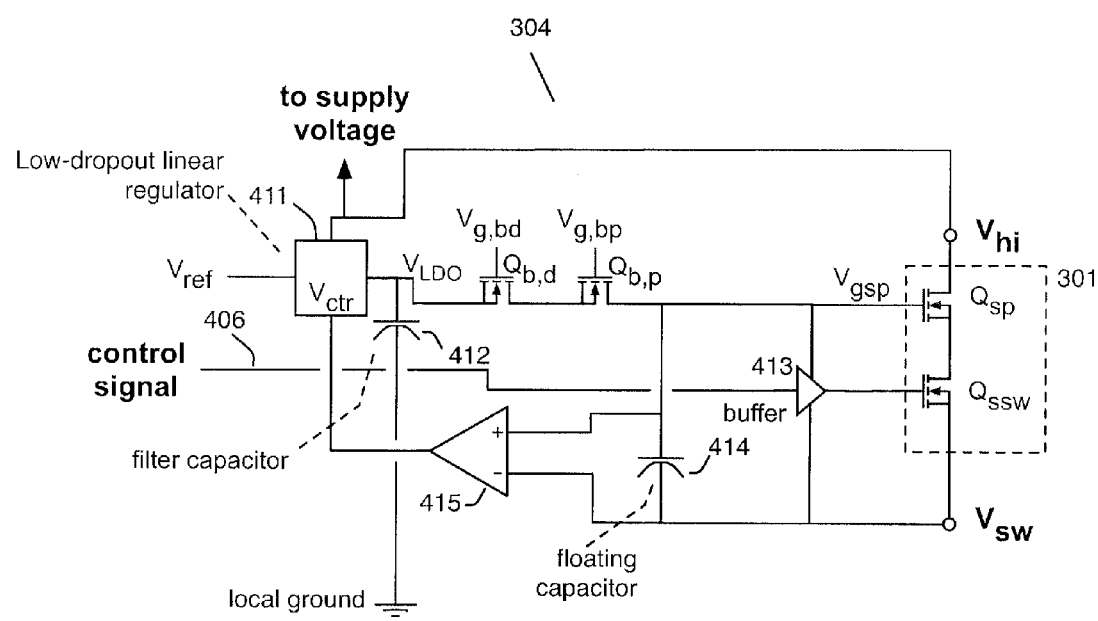
FIG. 16 shows an example of an embodiment of a bootstrap circuit that addresses deficiencies of conventional bootstrap circuits.

FIG. 16 shows an example of an embodiment of a bootstrap circuit 304 that addresses the described deficiencies. The supply voltage $V_{hi}$ is directed to the input of a low-dropout linear regulator (LDO) 411, whose efficiency has little impact on the overall system efficiency since the amount of power being supplied to the drivers is minimal and whose output voltage can be substantially equal to the LDO's power supply voltage. The output of the LDO is directed to a filter capacitor 412 tied to local ground potential. When transistors $Q_{b,d}$ and $Q_{b,p}$ are conducting, the LDO generates the previously described second switching gate voltage $V_{gsp}$.

This filter capacitor 412 supplies voltage to the pair of NMOS transistors $Q_{b,d}$ and $Q_{b,p}$ connected in series. An embodiment includes the first transistor being driven by a level-shifted replica 406 of the driving voltage 312 applied to the shunt switch transistor of FIG. 13. In consequence, when the shunt switch transistors 302 are on and $V_{sw}$ falls to the local ground potential $V_{loc}$, transistor $Q_{b,d}$ is also turned on, so that the filter capacitor can supply charge to the floating capacitor 414. When the shunt switch 302 is off, the series switch 301 is on, and $V_{sw}$ rises to the local supply potential $V_{hi}$, transistor $Q_{b,d}$ is turned off, and the floating capacitor 414 can follow $V_{sw}$, that the high side of the floating capacitor 414 is maintained above the local supply voltage $V_{hi}$ by the desired voltage $V_{LDO}$.

During the previously described second period, the floating capacitor is charged. The charging capacitor 414 is connected between the common node ($V_{sw}$) and a gate of the NMOS series protection transistor, and aids in control of the switching gate voltage Vgsp. One embodiment includes the floating capacitor being charged during the second period by closing a switch that provides a conductive path between the linear regulator (LDO) and the floating capacitor. A more specific embodiment includes the gate voltages of the bootstrapping transistors $Q_{b,d}$ and $Q_{b,p}$ being turned on when the shunt switch element 302 is closed, and the pair of bootstrapping transistors $Q_{b,d}$ and $Q_{b,p}$ provide a conductive path between the low-dropout linear regulator 411 and the floating capacitor 414. When transitioning from the second period to the first period upon closing the series switch element 301, the floating capacitor 414 provides a voltage boost of the switching gate voltage when $V_{sw}$ rises. That is, the floating capacitor provides a voltage that is higher than the first supply voltage to the switching gate voltage when transitioning to the first period upon closing the series switch element.

Transistor $Q_{b,p}$ acts as a protection transistor for $Q_{b,d}$, in the same fashion described above with respect to the main switching transistors. The voltage $V_{g,bp}$ applied to this transistor is obtained using a diode to level-shift the voltage applied to the gate of $Q_{b,d}$, and then filtering the result with a capacitor, to ensure that the voltage on the protection transistor gate, $V_{g,bp}$ always exceeds the average voltage applied to the switching transistor gate, $V_{g,bd}$.

The output voltage of the regulator $V_{LDO}$ is controlled by the input voltage $V_{ctr}$, which is proportional to the voltage across the floating capacitor 414, extracted by a differential buffer 415.

The circuit of FIG. 16 provides a number of advantages over the described diode-based bootstrap supply. The circuit can be implemented using standard NMOS devices and standard CMOS processes. The voltage supplied is regulated and cannot exceed the intended values with a new battery. The voltage supplied can approach the local supply voltage to within the on-resistance of the series NMOS devices and the regulator, and thus is not limited by a diode voltage drop, so performance is not impaired as the battery ages. Fast NMOS devices can be used for the switching function $Q_{b,d}$, so operation of the circuit does not depend on reverse-bias recovery times. The reuse of the control input $V_{gshsw}$ ensures that timing synchrony between the bootstrapped supply operation and the operation of the stacked switches is maintained as duty cycle varies.

For particular embodiments, the buffer amplifier 413 used in the circuit of FIG. 16 is a conventional tapered CMOS buffer, but the supply rails for this buffer are the switch node potential $V_{sw}$ and the high side of the floating capacitor 414, which is somewhat less than $V_{LDO}$ above $V_{sw}$. The control voltages supplied to this buffer amplifier must therefore also be referenced to the switching node potential $V_{sw}$ rather than the local ground potential $V_{loc}$. The exemplary embodiment of a level-shifting circuit 305 of FIG. 17 addresses this requirement.

The previously described switching gate voltage can be generated by level-shifting a control voltage from the controller. For an embodiment, level shifting the control voltage includes referencing the switching gate voltage to the voltage potential of the common node.

The voltage difference ($aV_{dd1}$-$V_{sw}$) is approximately equal to the maximum allowed DC voltage for the transistors in use, e.g. 2.0 V for 0.18 micron technology. The voltage $aV_{dd2}$ is also set to this value, referenced to the ground node. The voltage $V_{sw}$+1 V is obtained by the use of a diode between $aV_{dd1}$ and $V_{sw}$, with capacitive filtering to remove transients.

The ground-referenced differential control voltage from the Controller is fed to a voltage-to-current converter 501. The output differential current on each branch passes through two cascode transistors, one pair 502 held at $aV_{dd2}$ and the other pair 503 at approximately $V_{sw}$+1.3V. The currents then pass through active loads, here represented in simplified form by resistors $R_{act}$, which convert the differential currents back to a differential voltage, which is fed into the differential transresistance amplifier 504 and thus through additional buffer stages 413 as appropriate to drive the series switch gate, $V_{gssw}$. In the preferred embodiment, the active loads are implemented as NMOS diodes with cross-coupled NMOS transistors to increase the AC load resistance, with some additional fixed resistors.

Figure 17:
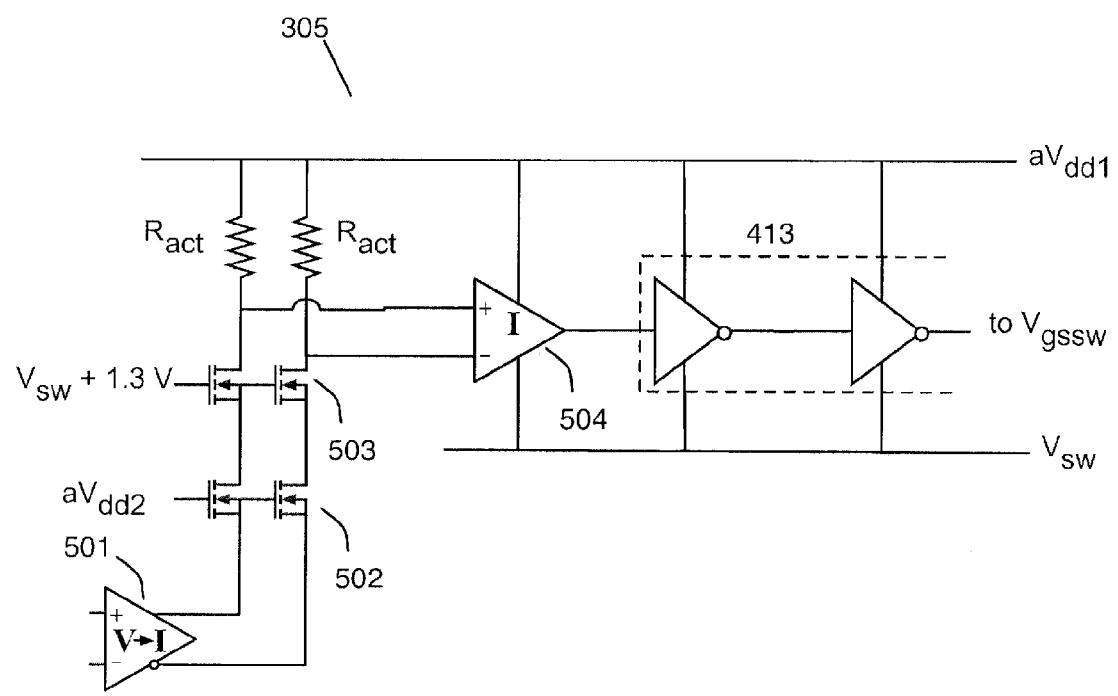
FIG. 17 shows an example of an embodiment of a level-shifting circuit.

It is important to note that the level shifting circuitry 305 shown in FIG. 17 can be substantially replicated, depicted as the delay block 307 in FIG. 12 to supply a control voltage to the shunt switch 302. In the delay block 307, the circuit is configured with the gate voltage applied to both transistors equal to $aV_{dd2}$, and thus no voltage shift results. However, the propagation delay is substantially identical to that encountered in the level shifting block, thus preserving exact synchrony of the control inputs to the series and shunt switches, vital for successful operation of the inventive high-frequency converter.

Spike Protection Circuit

The use of extremely fast switching times, as described previously, minimizes dissipation in the channel of the switching transistors during the transition from the OFF state to the ON state. However, to employ such fast switching times in a conventional low-voltage process without deleterious impact on the reliability of the converter, added precautions are required. In any practical implementation of a converter, the connections providing current from the supply (such as a battery) to the high side of the series switch are associated with a finite parasitic inductance $L_{par,hi}$. This inductance is the net result of several physical inductances present in any realistic packaged device, including the parasitic inductance of decoupling capacitors external to the package, the parasitic inductance of the traces and/or wirebonds connecting the supply leads or bumps to the contact pads on the integrated circuit containing the converter, and a typically smaller but still not negligible contribution from traces on the converter IC itself. The equivalent inductance of these various contributions is typically neglected in the design of conventional low-frequency converters. Prior-art high-frequency converters using resonant gate drives, where the switching voltage provided to the gate of the switching device is substantially sinusoidal and therefore the switching transition is relatively slow, have heretofore also neglected this inductance.

Figure 18:
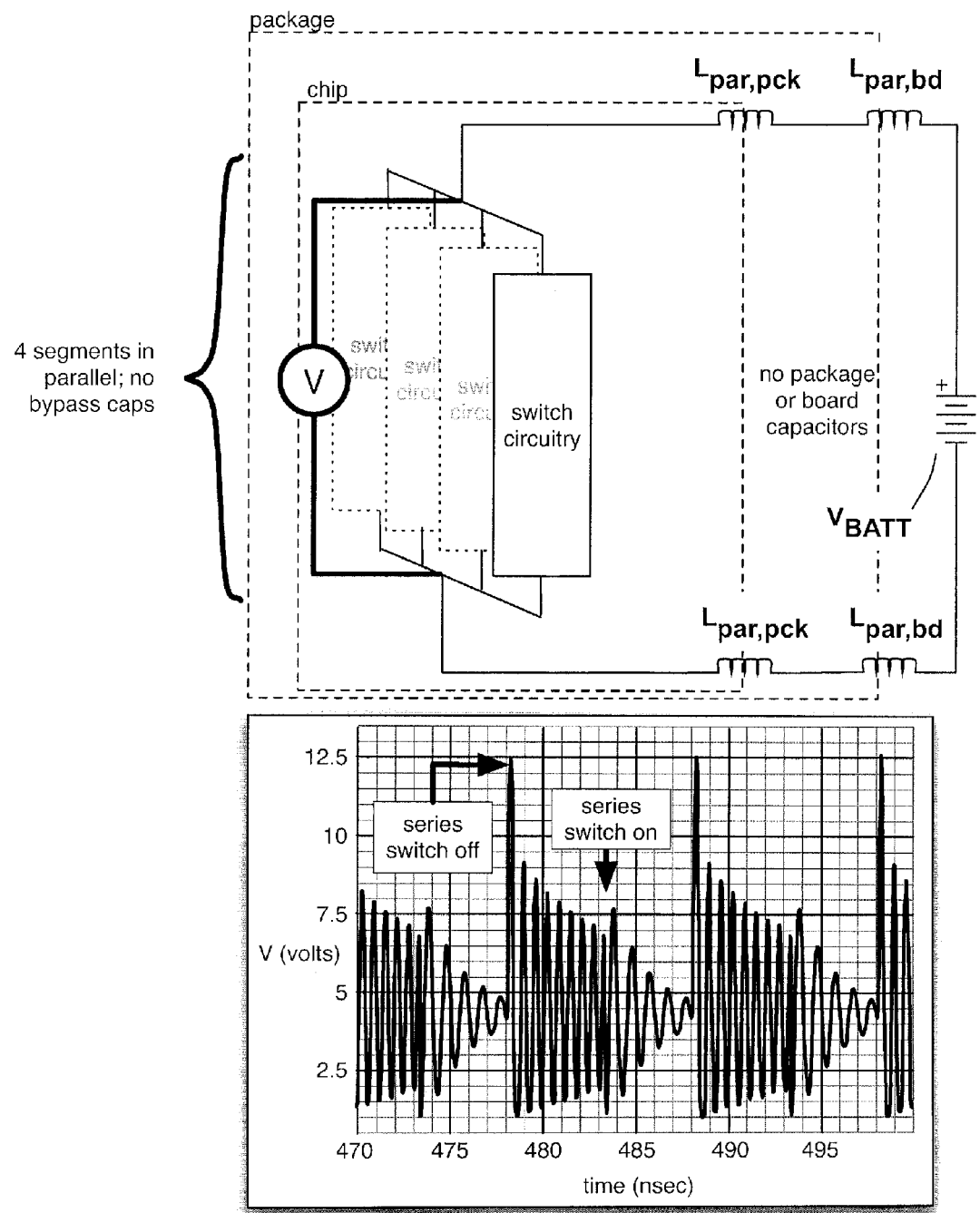
FIG. 18 shows switching circuitry segmented into four sections, and an example of a persistent ringing condition as a result of a rapid voltage transition.

However, the described embodiments can employ very fast switching transitions, and shunt capacitance is not intentionally added to the switching transistors as might be the case in a prior-art Zero Voltage Switching approach. In consequence, referring again to FIG. 12, when the series switch 301 is ON, the full output current passes through the parasitic inductor $L_{par,hi}$. When the series switch 301 is rapidly turned off, this parasitic inductor tries to maintain the same output current, causing the voltage $V_{hi}$ to increase rapidly in the absence of any preventive measures. It may also be anticipated that, in the absence of dissipation within the circuit, the parasitic inductance may interact with parasitic capacitances to form a high-frequency resonant circuit, which will create a persistent ringing condition as a result of the initial rapid voltage transition. An example is depicted in FIG. 18. In this case, a realistic stacked switching circuit, partitioned into four blocks, was simulated using the fast switching transitions described previously, with realistic values for parasitic inductance ($L_{par,pk}$, $L_{par,bd}$) associated with the semiconductor package and printed circuit board, but no bypass capacitance or spike prevention provided. It is apparent that at the moment the series switch turns off, the local supply voltage spikes to as high as 12.5 volts, greatly in excess of the maximum limit even for a stacked (cascode) configuration if using 0.18 micron devices. In addition, the circuit displays an extended ringing behavior with a characteristic frequency of roughly 1.5 GHz. When the series switch turns on, the local supply potential falls rapidly to voltages as low as 1 V and then rings at a frequency of about 1 GHz. In each case, the ringing amplitude displays slow damping over the course of 5-10 nsec. It should be noted that inclusion of an off-chip capacitor does not appreciably affect the size of the spikes.

It should be noted that voltage spikes will occur in any converter that has fast switching transitions without added shunt capacitance around the switches, irrespective of whether the switching elements are stacked NMOS switches, or any other type of switch that includes, for example, PMOS transistors, a single PMOS transistor, a single NMOS transistor, or any other fast switching device. Additionally, while the detailed behavior shown in FIG. 18 may be specific to the described embodiments, the general phenomena of excessive voltage excursions (spikes) and ringing will occur any time a fast switching transition without added shunt capacitance is used in a converter.

Clearly, it is desirable to provide spike protection circuitry for the series and shunt switch elements of any DC-DC converter employing fast switching transitions as described above. Ideally, the spike protection includes capacitive elements between previously described first voltage supply and second voltage supply. For an embodiment, the spike protection circuitry includes a transmission line having minimal parasitic inductances, thereby minimizing the impedance of the transmission line.

Figure 19:
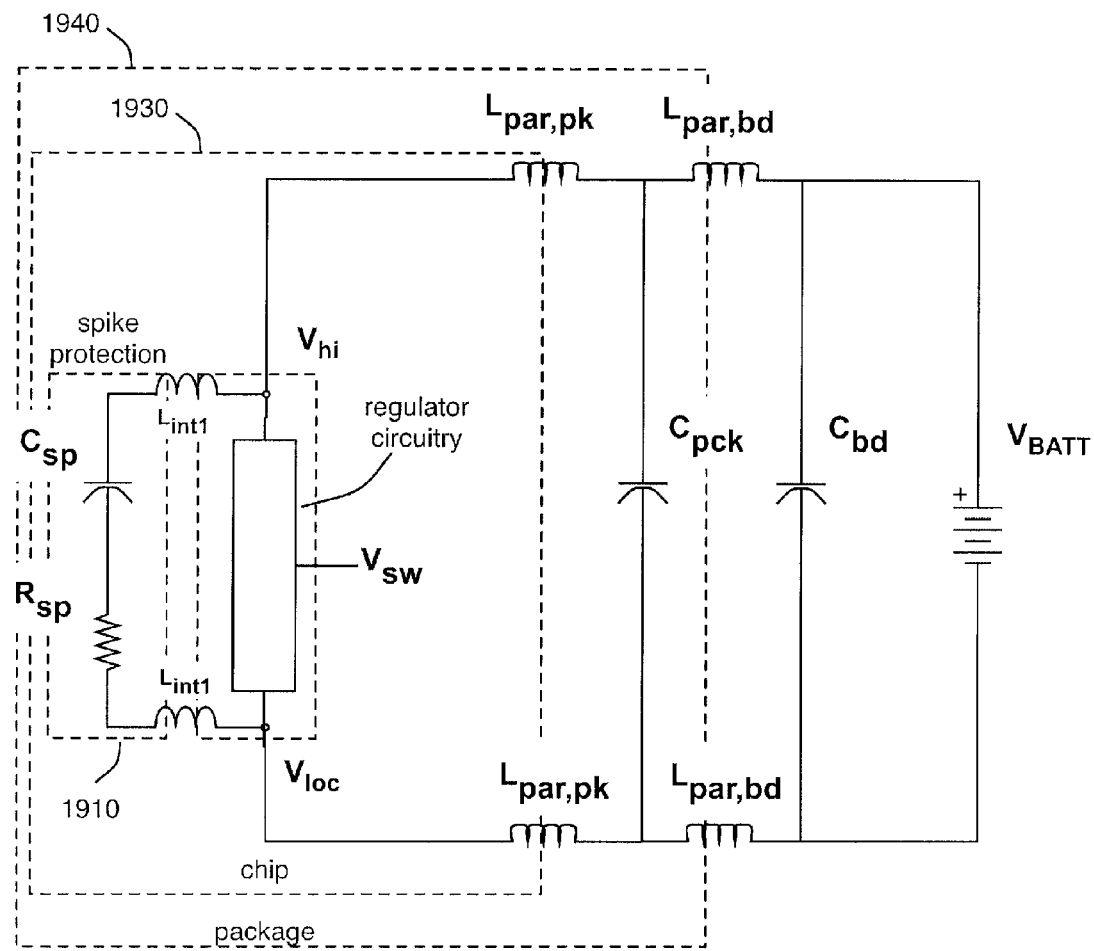
FIG. 19 shows an example of a voltage regulator that further includes spike protection circuits.

FIG. 19 shows an example of a voltage regulator that further includes a spike protection circuit 1910. The spike protection circuit 1910 provides a charge-storage circuit between the first voltage (power) supply and the second voltage (power) supply. As shown, the spike protection circuit 1910 is located on the same integrated circuit 1930 as the series and shunt switch elements. The charge-storage circuits include capacitive elements ($C_{SP}$) that are disposed on a same integrated circuit as the series switch element and the shunt switch element, adjacent to each of the series switch element and the shunt switch element. The integrated circuit is located within a package 1940. More specifically, the spike protection circuitry 1910 is proximally placed directly on the integrated circuit 1930, and can be disposed on both sides of the switching circuitry, and with no functional blocks except interconnections between the switching circuitry and the spike protection circuitry 1910. An embodiment includes the capacitive elements being located on opposing sides of each of the series switch element and the shunt switch element.

It is important to note that in the absence of the dissipative impedance, represented in simplified form in FIG. 19 by $R_{sp}$, the spike protection capacitance may form a high-quality-factor (high-Q) series resonant circuit with the parasitic inductances $L_{par,pk}$ and $L_{int1}$, where $L_{int1}$ is a parasitic inductance of the internal on-chip circuitry. The response of such a circuit to a step-function excitation, such as that effectively provided when the series switch suddenly transitions from ON to OFF, will result in a persistent sinusoidal voltage at the resonant frequency, as depicted in FIG. 18. Furthermore, the magnitude of this resonant voltage across each series component may greatly exceed the magnitude of the total voltage across the resonator. The sinusoidal voltage will persist until its energy is dissipated by losses within the resonator or associated components. This is a highly undesirable situation, since each excursion of the node voltage will produce additional stress to the series and/or shunt switch transistors, and ringing may also lead to interference with the operation of nearby circuits, both in the DC-DC converter and in other circuits on the same chip, when the converter is part of an integrated system. The ringing might also cause a loss in efficiency if the ringing is poorly timed with the opening or closing of one of the switches. It is therefore important to incorporate a dissipative element in the spike protection impedance, represented schematically by $R_{sp}$, to minimize undesired ringing in the spike protection circuit. That is, the dissipative element damps ringing of a power supply to the regulator circuitry. For an embodiment, the dissipative element critically damps ringing of a power supply to the regulator circuitry.

The value of this dissipative element is selected based on a number of considerations. Firstly, the impedance of the element must itself be small enough so that the voltage resulting when the output current flows through it is small compared to the maximum voltages allowed at the junctions of the switching transistors, to ensure that the dissipative impedance does not itself create voltages that degrade reliability. Secondly, the dissipative element must be large enough to suppress excessive ringing in the series resonant circuit consisting of the parasitic inductances and the spike dissipation circuitry. Finally, the least value of dissipation that produces acceptable ringing suppression should be employed, as the dissipation in the equivalent resistor $R_{sp}$ is lost to the load and thus degrades overall system efficiency. It is in general not possible to provide a simple analytic formula for the exact dissipation value, which must instead be found through detailed circuit simulation and optimization of the two relevant figures of merit: the overall converter efficiency, and the root-mean-square (RMS) voltage applied to the switching transistor gate-drain or gate-source connections. For one embodiment, the optimal resistance value is typically close to that which matches the characteristic impedance of a lumped-element approximation to a transmission line, that is:

$$R_{sp} \approx \sqrt{\frac{L_{par,pk} + L_{par,pk}}{C_{sp}}}$$

For an embodiment, a value of resistance of the dissipative element matches a characteristic impedance of a lumped-element approximation of a transmission line, wherein the transmission line comprises the charge-storage circuit and a parasitic inductance associated with the regulator circuitry.

For another embodiment, value of resistance of the dissipative element is based on a characteristic impedance of a lumped-element approximation of a transmission line, wherein the transmission line comprises the charge-storage circuit and a parasitic inductance associated with the regulator circuitry. For an embodiment, the parasitic inductance includes an inductance associated with at least an integrated circuit package that includes the voltage regulator, and an integrated circuit that includes the voltage regulator.

For an embodiment, the dissipative element suppresses ringing of the regulated voltage during a switching period of the switching element. An embodiment includes a value of resistance of the dissipative element being selected to prevent degradation of the switching elements.

Figure 20:
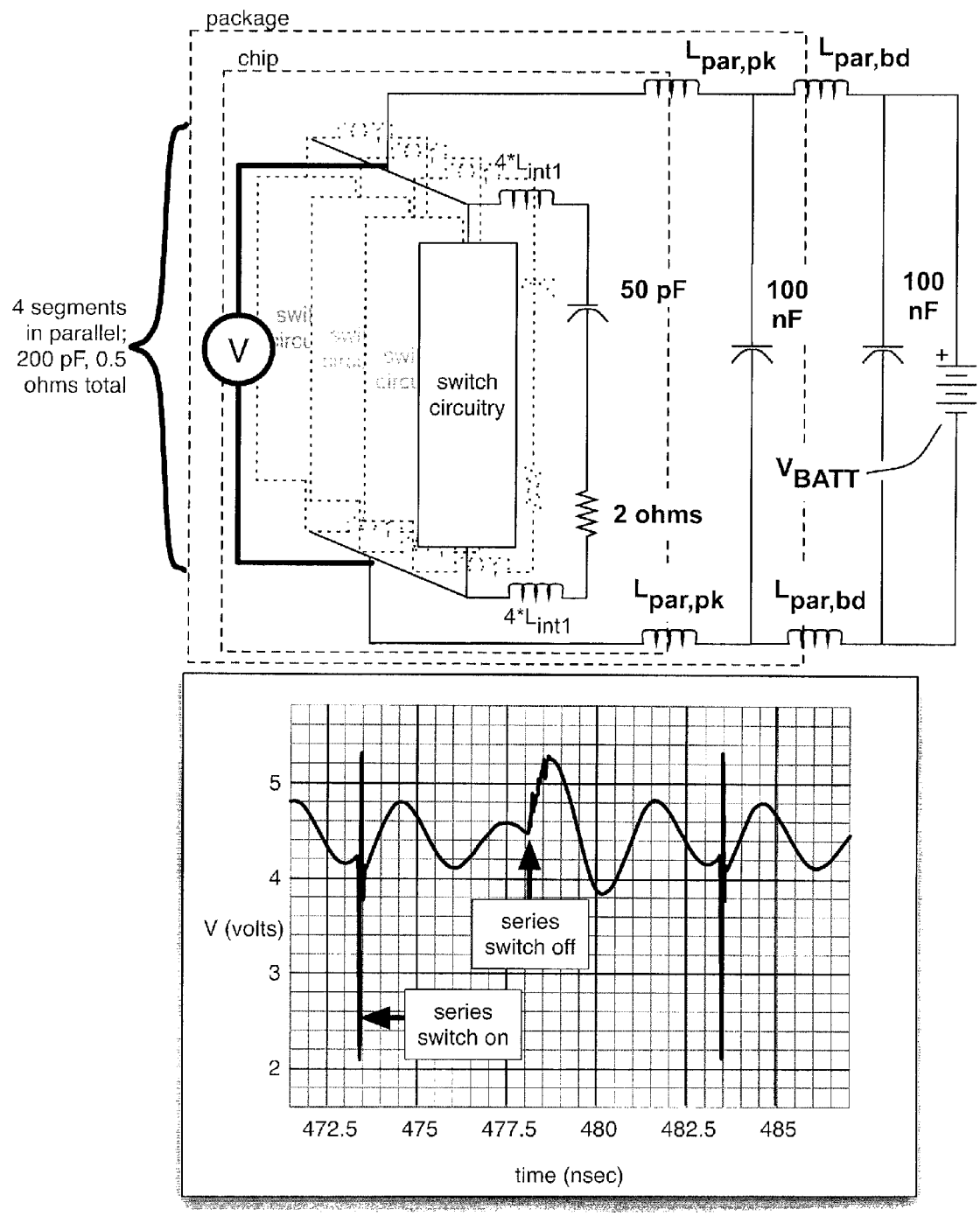
FIG. 20 shows switching circuitry segmented into four sections, spike protection circuitry, and an example of the resulting damping of the ringing condition.

In the exemplary embodiment, for which simulation results are presented in FIG. 20, the switching circuitry and associated spike protection circuitry are partitioned into four segments, as discussed elsewhere. Each spike protection segment provides an equivalent capacitance of 50 pF and an equivalent dissipative resistance of 2 ohms, so that the whole converter provides spike protection dissipation roughly equivalent to a value of 0.5 ohms for $R_{sp}$, and equivalent capacitance $C_{sp}$ of 200 pF, while switching a supply current of 600 mA. As can be observed by comparison with FIG. 18, the local supply voltage spikes are substantially reduced.

In an embodiment, the voltage spike protection circuitry is formed using the gate-to-channel capacitance of MOS structures. MOS structures are employed by this embodiment because they provide the highest capacitance per unit area typically available in a standard CMOS process. For an embodiment, at least one MOS structure includes the charge-storage circuit and at least a portion of the dissipative element. Other capacitor structures, such as parallel-plate metal-insulator-metal (MIM) capacitors, edge-defined capacitors, trench capacitors, or various columnar or pillar structures such as those well-known in the art for use in DRAM storage cells, can be used if they are available in a given process. In general, the voltage that can be safely applied across an MOS structure between the gate and the common source/drain/body connection is similar to that allowable between the gate and any other device terminal in ordinary MOS transistor operation. Since the voltage spike protection circuit 303 is connected between the local terminals $V_{hi}$ and $V_{loc}$, between which is at least the DC supply voltage, it may be necessary to place multiple MOS capacitors in series in order to ensure that the voltage across the terminals of any one capacitor is acceptably small. For an embodiment, a voltage across each MOS capacitor is maintained below a predetermined threshold as determined by a maximum allowed DC voltage of each MOS capacitor. A bias network may be used to ensure that the intermediate node voltage between the series MOS structures interpolates the applied DC potential as desired, without affecting the AC characteristics of the decoupling network. In the exemplary embodiment, relatively heavily-n-doped wells are used to maximize capacitance between the gate and channel/body region, but conventional NMOS or PMOS devices can also be used.

Dissipative elements $R_{sp}$ can be incorporated in series with the capacitors. These dissipative elements can be realized as polysilicon resistors, thin film metallic resistors, or any other convenient resistive element. The equivalent series resistance associated with the capacitor structures varies depending on the process used and the approach employed for capacitor fabrication, and in some cases may be sufficiently large that additional dissipative elements are not required.

In general, increasing the value of the capacitor $C_{sp}$ will lead to an increased parasitic inductance $L_{int1}$ for any given capacitor technology and layout, because the physical size of the capacitor increases, and thus the distance current must be carried by the interconnecting wires increases. The parasitic inductance associated with a given capacitor structure may be reduced by good layout guidelines; for example, contacts should not be placed at opposite ends of a rectangular structure, but preferably near the center of the structure, or both located at one end thereof, in order to reduce the parasitic inductance. However, for increasing maximum current, it becomes difficult to construct a single capacitor with sufficiently low inductance. For example, for a doubling of the maximum output current, the protection capacitance must double, but the inductance (which scales with the capacitance) must be halved. For any given technology and capacitor structure and layout, an output current will be reached at which the parasitic inductance become excessive.

A solution to this problem can be found by further subdividing switching elements of the switching circuitry 301 and 302 into segments (switching block segments) connected in parallel, such that each segment carries a portion of the total output current, and further partitioning the protection circuit $C_{sp}$-$R_{sp}$ into separate segments, each protecting one of the switching block segments. In an embodiment, the protection circuitry is further subdivided such that a portion of the protection circuit is disposed on each side of the switching circuit segment, and optionally in other convenient locations proximate to the switches themselves. For an embodiment, at least a portion of the voltage spike protection circuitry is located between the plurality of switching block segments. The spike protection circuitry can include charge-storage circuit segments. An embodiment includes each charge-storage circuit segment of the spike protection circuit being located physically closer to the switching block segment it protects than any other switching block segment.

Figure 21:
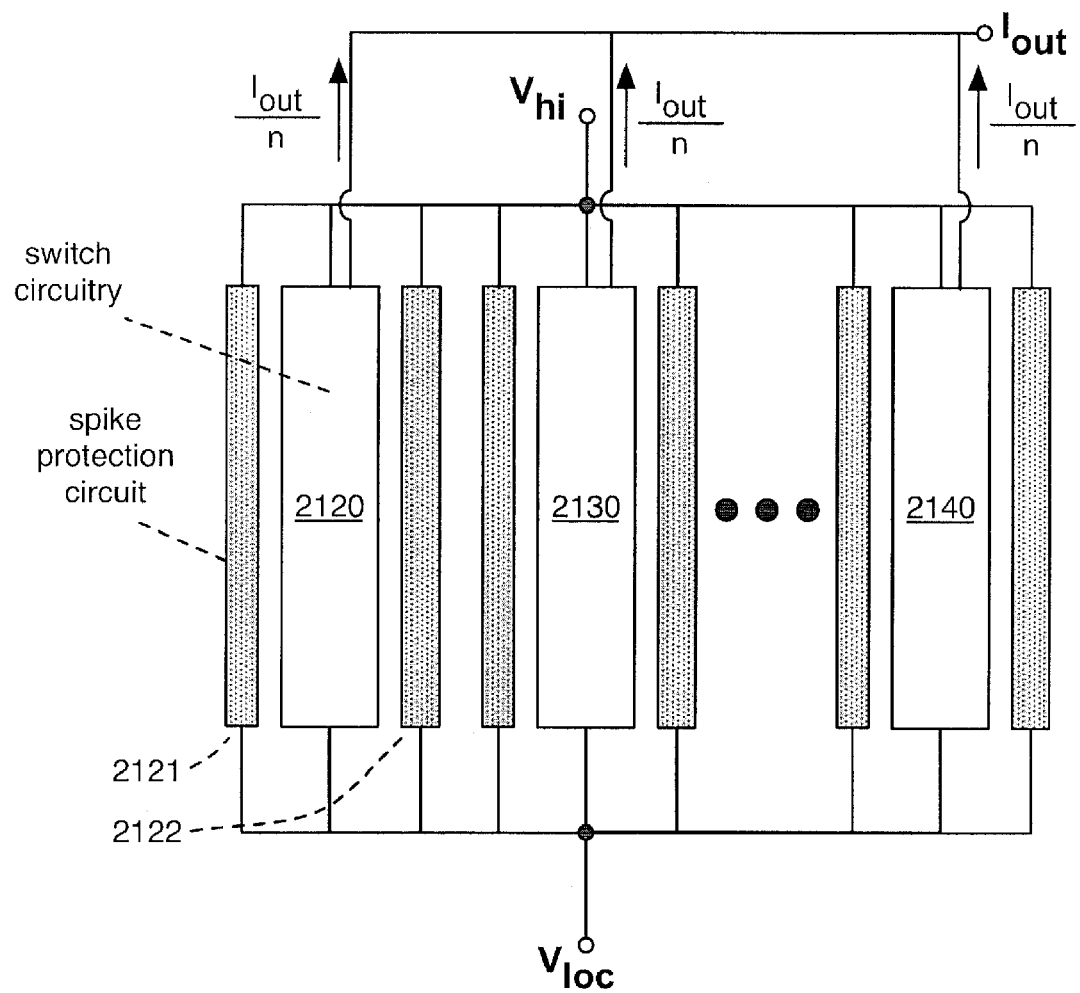
FIG. 21 shows an example of the switching circuitry partitioned into a number of segments, and protection circuitry segments associated with each switching circuitry segment.

An example is shown in FIG. 21, in which the switching circuitry (switching elements) 301 and 302 is partitioned into a number of switching block segments 2120, 2130, 2140, and so on, and associated with each segment are protection circuitry blocks, such as 2121 and 2122. In this configuration, the maximum current associated with each capacitance structure is reduced (by a factor of n if n blocks are present), and thus the required physical size is reduced sufficiently to minimize parasitic inductance. In general, total output current will be shared roughly equally between the various segments of the switching circuitry, although unequal sharing may be advantageous in some applications.

Figure 22:
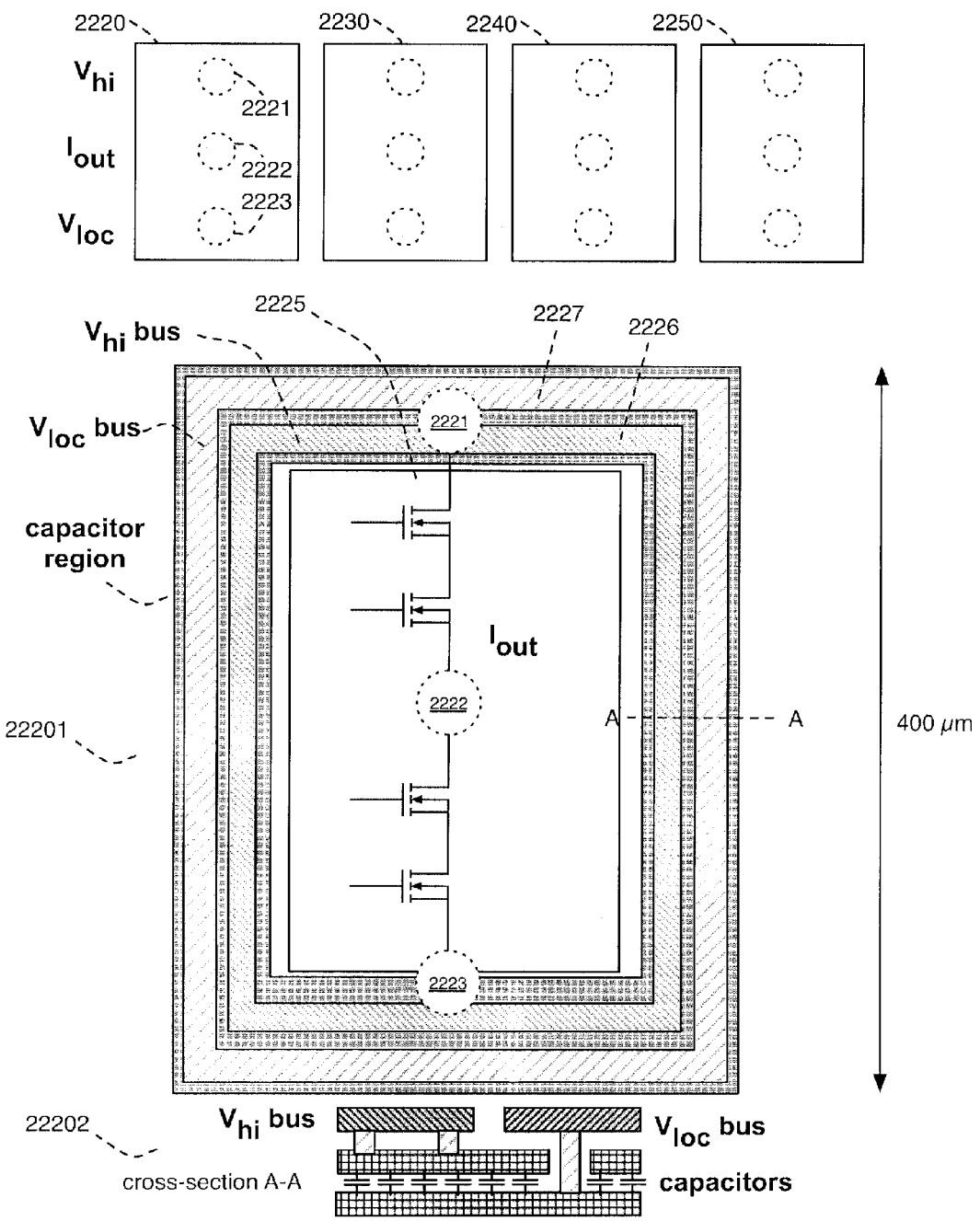
FIG. 22 shows an example of a layout of a segmented voltage converter.

An exemplary implementation of such a segmented converter is depicted schematically in FIG. 22. In the exemplary embodiment, four segments 2220, 2230, 2240, and 2250 each provide 150 mA maximum output current, for a total of 600 mA maximum output current. For an embodiment, each segment is approximately 400 microns in height, and has three contacts, shown for the segment 2220 as 2221, 2222, and 2223, connected respectively to the supply voltage $V_{hi}$, the output inductor (carrying current $I_{out}$), and the local ground connection $V_{loc}$. In the exemplary embodiment, these connections are made using a ball grid array package, but bond wires or other contact means may be employed. A close-up of one of the segments 22201 shows bus 2226 for the first supply voltage $V_{hi}$, connected to ball contact 2221 (using upper-level metallization not shown here for clarity), and bus 2227 for local ground $V_{loc}$, connected to ball contact 2223 (again using upper level metallization, not shown here). Central block 2225 contains the switching circuitry, described in detail above, with the output current thereof connected to ball contact 2222. The buses 2226 and 2227 surround the switching circuitry block 2225. Via contacts are employed to connect buses 2226 and 2227 to blocks of capacitors disposed in a capacitor region located generally below the buses, as shown in the cross-sectional image 22202. The capacitors may be implemented in any convenient fashion for the process in use, as described previously; in the preferred embodiment, the capacitors are implemented as two NMOS structures in series, as described above. The ring-shaped buses provide the minimum parasitic inductance for a given spike protection capacitance. (Dissipation resistances $R_{sp}$, being compact, are not shown here, but may be placed in any convenient location along the bus contacts.) In an embodiment, a capacitance of 50 pF per segment, with a parasitic inductance of less than 80 pH per segment, can be obtained from the use of ring-shaped buses with capacitance distributed below the buses. The resulting overall equivalent circuit has 200 pF spike protection capacitance with only about 20 pH parasitic inductance, for the full converter composed of four segments. As shown in FIG. 20, this results in maximum spike voltages on the order of 0.9 V for times on the order of 1 nsec, with some ringing at slightly lower voltage levels. For an exemplary DC voltage of 4.4 V, the RMS voltage applied to the stacked switches is increased by only about 0.1 V to 4.5 V, which typically has an insignificant effect on reliability.

Although specific embodiments have been described and illustrated, the embodiments are not to be limited to the specific forms or arrangements of parts so described and illustrated.

What is claimed:

1. A voltage regulator, comprising:
   regulator circuitry generating a regulated voltage from a first power supply and a second power supply;
   voltage spike protection circuitry for voltage-spike-protecting the regulator circuitry, comprising a dissipative element and a charge-storage circuit; wherein
   a value of resistance of the dissipative element is based on a characteristic impedance of a lumped-element approximation of a transmission line, wherein the transmission line comprises the charge-storage circuit and a parasitic inductance associated with the regulator circuitry.

2. The voltage regulator of claim 1, wherein the parasitic inductance comprises an inductance associated with at least an integrated circuit package that includes the voltage regulator, and an integrated circuit that includes the voltage regulator.

3. The voltage regulator of claim 1, wherein the parasitic inductance comprises an inductance associated with a power supply of the regulator circuitry.

4. The voltage regulator of claim 1, wherein the dissipative element damps ringing of a power supply to the regulator circuitry.

5. The voltage regulator of claim 1, further comprising at least one MOS structure, wherein the MOS structure comprises the charge-storage circuit and at least a portion of the dissipative element.

6. The voltage regulator of claim 1, wherein charge-storage circuit comprises a plurality of MOS capacitors connected in series, wherein a voltage across each MOS capacitor is maintained below a predetermined threshold as determined by a maximum allowed DC voltage of each MOS capacitor.

7. The voltage regulator of claim 1, further comprising at least one switching element.

8. The voltage regulator of claim 7, wherein the dissipative element suppresses ringing of the regulated voltage during a switching period of the at least one switching element.

9. The voltage regulator of claim 7, wherein a value of resistance of the dissipative element is selected to prevent degradation of the at least one switching element.

10. The voltage regulator of claim 7, wherein the at least one switching element comprises a plurality of switching block segments.

11. The voltage regulator of claim 10, wherein at least a portion of the voltage spike protection circuitry is located between the plurality of switching block segments.

12. The voltage regulator of claim 10, wherein the charge-storage circuit comprises charge-storage circuit segments, and each charge-storage circuit segment of the spike protection circuit is physically closer to the switching block segment it protects than any other switching block segment.

13. A method of generating a regulated voltage, comprising:
regulator circuitry generating a regulated voltage from an input voltage;
voltage-spike-protecting the regulator circuitry with voltage spike protection circuitry, wherein the voltage spike protection circuitry comprises a dissipative element and a charge-storage circuit; wherein
a value of resistance of the dissipative element is based on a characteristic impedance of a lumped-element approximation of a transmission line, wherein the transmission line comprises the charge-storage circuit and a parasitic inductance associated with generation of the regulated voltage.

14. The method of claim 13, wherein the parasitic inductance comprises an inductance associated with at least an integrated circuit package and an integrated circuit.

15. The method of claim 14, wherein the inductance comprises an inductance associated with a power supply to circuitry that generates the regulated voltage.

16. The method of claim 13, wherein a value of resistance of the dissipative element is selected to critically damp ringing of a power supply to circuitry that generates the regulated voltage.

17. The method of claim 13, wherein a resistance of the dissipative element damps ringing of a power supply to circuitry that generates the regulated voltage.

18. The method of claim 13, wherein at least one MOS structure includes the charge-storage circuit and at least a portion of the dissipative element.

19. The method of claim 13, wherein the charge-storage circuit comprises a plurality of MOS capacitors connected in series, wherein a voltage across each MOS capacitor is maintained below a predetermined threshold as determined by a maximum allowed DC voltage of each MOS capacitor.

20. The method of claim 13, further comprising generating the regulated voltage though controlled closing and opening of at least one switch element.

21. The method of claim 20, wherein a value of resistance of the dissipative element is selected to suppress ringing of the regulated voltage during a switching period of the at least one switching element.

22. The method of claim 21, wherein at least one characteristic of the dissipative element is additionally selected to prevent degradation of the at least one switch element.

23. The method of claim 21, wherein at least one switch element is segmented into a plurality of switching block segments.

24. The method of claim 23, wherein at least a portion of the voltage spike protection circuitry is located between the plurality of switching block segments.

25. The method of claim 23, wherein each charge-storage circuit segment of the spike protection circuit is physically closer to the switching block segment it protects than any other switching block segment.

26. A method of generating a regulated voltage, comprising:
regulator circuitry generating the regulated voltage though controlled closing and opening of a series switch element and shunt switch element, the series switch element being connected between a first voltage supply and a common node, and the shunt switch being connected between the common node and a second supply voltage, comprising;
closing the series switch element during a first period;
closing the shunt switch element during a second period;
wherein the series switch element and the shunt switch element form switching blocks, and each switching block comprises a plurality of switching block segments, and further comprising voltage-spike-protecting the regulator circuitry with voltage spike protection circuitry, wherein the voltage spike protection circuitry comprising a dissipative element and a charge-storage circuit; wherein
a value of resistance of the dissipative element is based on a characteristic impedance of a lumped-element approximation of a transmission line, wherein the transmission line comprises the charge-storage circuit and a parasitic inductance associated with the regulator circuitry.

27. A voltage regulator, comprising:
regulator circuitry generating a regulated voltage from a first power supply and a second power supply;
voltage spike protection circuitry for voltage-spike-protecting the regulator circuitry, comprising a dissipative element and a charge-storage circuit; wherein
the charge-storage circuit comprises a plurality of MOS capacitors connected in series, wherein a voltage across each MOS capacitor is maintained below a predetermined threshold as determined by a maximum allowed DC voltage of each MOS capacitor.

28. A voltage regulator, comprising:
regulator circuitry generating a regulated voltage from a first power supply and a second power supply;
voltage spike protection circuitry for voltage-spike-protecting the regulator circuitry, comprising a dissipative element and a charge-storage circuit;
at least one switching element, wherein the at least one switching element comprises a plurality of switching block segments; wherein
the charge-storage circuit comprises charge-storage circuit segments, and each charge-storage circuit segment of the spike protection circuit is physically closer to the switching block segment it protects than any other switching block segment.

29. A voltage regulator, comprising:
regulator circuitry generating a regulated voltage from a first power supply and a second power supply, the regulator circuitry comprising a series switch element and a shunt switch element connected between the first power supply and the second power supply, and a switching controller operative to generate a switching voltage through closing and opening of a series switch and a shunt switch as controlled by a series switch control signal and a shunt switch control signal;
voltage spike protection circuitry connected between the first power supply and the second power supply for voltage-spike-protecting the regulator circuitry, the voltage spike protection circuitry comprising a dissipative element, an inductive element, and a capacitive element;

wherein the value of resistance of the dissipative element matches a characteristic impedance of a lumped-element approximation of a transmission line, wherein the transmission line comprises a charge-storage circuit and a parasitic inductance associated with the regulator circuitry.

30. A method of generating a regulated voltage, comprising:
    regulator circuitry generating a regulated voltage from an input voltage;
    voltage-spike-protecting the regulator circuitry with voltage spike protection circuitry, wherein the voltage spike protection circuitry comprises a dissipative element and a charge-storage circuit; wherein
    the charge-storage circuit comprises a plurality of MOS capacitors connected in series, wherein a voltage across each MOS capacitor is maintained below a predetermined threshold as determined by a maximum allowed DC voltage of each MOS capacitor.

31. A method of generating a regulated voltage, comprising:
    regulator circuitry generating a regulated voltage from an input voltage;
    voltage-spike-protecting the regulator circuitry with voltage spike protection circuitry, wherein the voltage spike protection circuitry comprises a dissipative element and a charge-storage circuit;
    at least one switching element, wherein the at least one switching element comprises a plurality of switching block segments; wherein
    the charge-storage circuit comprises charge-storage circuit segments, and each charge-storage circuit segment of the spike protection circuit is physically closer to the switching block segment it protects than any other switching block segment.

* * * * *